US006652718B1

United States Patent
D'Couto et al.

(10) Patent No.: US 6,652,718 B1
(45) Date of Patent: Nov. 25, 2003

(54) USE OF RF BIASED ESC TO INFLUENCE THE FILM PROPERTIES OF TI AND TIN

(75) Inventors: Gerard C. D'Couto, San Jose, CA (US); George Tkach, Santa Clara, CA (US); Michal Danek, Cupertino, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 10/060,724

(22) Filed: Jan. 30, 2002

Related U.S. Application Data

(60) Provisional application No. 60/265,428, filed on Jan. 30, 2001.

(51) Int. Cl.[7] ............................ C23C 14/34; C23C 14/36
(52) U.S. Cl. ............................ 204/192.3; 204/192.15; 204/192.22
(58) Field of Search ...................... 204/192.15, 192.22, 204/192.3

(56) References Cited

U.S. PATENT DOCUMENTS

| 5,457,298 A | * | 10/1995 | Nelson et al. ............ 219/121.52 |
| 6,028,003 A | | 2/2000 | Frisa et al. ................... 438/653 |
| 6,033,541 A | | 3/2000 | Xu et al. .................. 204/298.03 |
| 6,080,285 A | | 6/2000 | Liu et al. ................. 204/192.12 |
| 6,197,167 B1 | * | 3/2001 | Tanaka .................... 204/192.15 |
| 6,217,721 B1 | * | 4/2001 | Xu et al. ................. 204/192.17 |

* cited by examiner

Primary Examiner—Steven H. VerSteeg
(74) Attorney, Agent, or Firm—DeLio & Peterson, LLC; Kelly M. Reynolds

(57) ABSTRACT

A method of depositing thin films comprising Ti and TiN within vias and trenches having high aspect ratio openings of 6:1 is disclosed. The Ti and TiN layers are formed on an integrated circuit substrate using a Ti target in a non-nitrided mode in a hollow cathode magnetron apparatus in combination with an RF biased electrostatic chuck to modulate the properties of the deposited Ti and TiN layers in the same chamber, without the use of a collimator or a shutter. The resulting Ti and TiN layers are superior in step coverage, grain size, grain orientation, roughness and uniformity such that subsequent filling of the high aspect ratio opening is substantially void-free.

26 Claims, 14 Drawing Sheets

USE OF RF BIASED ESC TO INFLUENCE THE FILM PROPERTIES OF TI AND TIN

PRIORITY

This application claims the benefit of U.S. Provisional Application No. 60/265,428 filed on Jan. 30, 2001.

RELATED APPLICATIONS

This application is related to U.S. patent application Ser. No. 10/060,725 allowed, filed the same day and assigned to the same assignee as the present application, the disclosure of which is incorporated herein by reference.

BACKGROUND OF THE INVENTION

1. Field of the Invention

The present invention relates to a method for depositing titanium (Ti) liner layers and titanium nitride TiN) barrier layers for applications in semiconductor processing.

2. Description of Related Art

In the manufacture of semiconductor devices, metal conductive layers are patterned for the purpose of making interconnections between different points on the device. After formation of this patterned metal conductive layer an electrically insulative material is deposited over the metal conductive layer. Vias may then be etched in the insulative layer in positions where contacts are desired between conductive regions. A robust diffusion barrier, or liner, may then be deposited into the via between the underlying metal and a metal layer deposited therein, such as by chemical vapor deposition of tungsten (W), for the formation of a stud. The robust diffusion barrier both prevents attack of the underlying metal and acts as an adhesion layer for stud.

In modern integrated circuit ("IC") technology, a metallization comprising a Ti layer, a TiN layer and a top conductive layer is often provided on a surface of a semiconductor body. The Ti layer serves to obtain good adhesion and low contact resistance between the metallization and the semiconductor body. Typically, the TiN layer serves as a barrier between a top conductive layer of Al and the underlying Ti layer, thereby preventing chemical reactions therebetween. Alternatively, the TiN layer may serve as a barrier between the Ti layer and a top conductive layer of W deposited using $WF_6$, thereby preventing chemical reactions between Ti and F which is formed during such a CVD process. An anti-reflective coating ("ARC") of TiN can also be deposited on the surface of the W or Al. Thus, a typical stack arrangement on an IC semiconductor substrate may include a Ti contact layer on the semiconductor surface, a TiN barrier layer, a W or Al interconnect layer, and a TiN ARC layer for the purpose of reducing optical reflection.

These films are generally deposited by physical vapor deposition (PVD), also known as sputtering. Various physical vapor deposition ("PVD") sputtering techniques known in the art for depositing TiN/Ti stacks may be categorized as either nitrided mode ("NM"), i.e., poisoned mode, or non-nitrided mode ("NNM"), i.e., metallic mode. In the NM (nitrided mode), typically a titanium target is placed in a sputter chamber, and the TiN layers are deposited by sputtering titanium with a sputter gas, such as argon ("Ar"), in the presence of nitrogen. In a NM technique, the titanium target is inundated with nitrogen atoms, becoming "nitrided", such that a coating of TiN forms on the surface of the titanium target. This decreases the overall deposition rate of the desired layer of TiN onto the IC substrate because the nitrogen in the titanium target interferes with the sputtering of titanium. A disadvantage is that the titanium target used to deposit TiN cannot then be used to deposit Ti. As a result, various separate deposition chamber techniques have been introduced in the art for depositing each of the Ti and TiN layers.

It is also known in the art to deposit the Ti/TiN stacks in the non-nitrided mode ("NNM"), i.e., metallic mode. Deposition of TiN in the NNM keeps the $N_2$ away from the target, hence, the target being non-nitrided or the target being in a metallic mode. In the NNM, the depositions of the Ti and TiN layers may be performed in the same deposition chamber, allowing for a higher throughput for the PVD system and allowing redundancy to be built into the system. It has been found that TiN deposited in the NNM mode tends to be a poor barrier by itself, often requiring having to anneal the NNM TiN deposited layer, such as by Rapid Thermal Nitridation or Rapid Thermal Anneal, to improve the TiN barrier properties. In so doing, the annealing step improves the barrier properties by causing growth at the grain boundary of the TiN, thereby reducing the diffusion of WF6 gas used for the CVD deposition of a W layer thereover, and hence improving the barrier properties. The nitridation or anneal step also influences the nucleation (initial growth steps) of the CVD W and plays an influential role in the final film properties of the CVD W film that is grown on the TiN barrier film. However, having to anneal the NNM TiN deposited layer requires additional processing steps and, as such, increases both time and processing expenses.

It is also known in the art to use a shutter that allows deposition of Ti and TiN in the same deposition chamber. A Ti layer is first deposited using a Ti target. Then, a TiN layer is deposited on the Ti layer using the same Ti target in a NM. During TiN deposition in the NM, the Ti target becomes nitrided, i.e., poisoned. Before depositing the Ti layer on the next wafer, the shutter is inserted between the target and the wafer, and the target is sputtered in the absence of nitrogen gas to sputter away the nitrided components to return the target to its clean, metallic state and ready for the sputtering of pure Ti. To reduce the inefficiency of using a shutter or separate chambers for Ti and TiN deposition, modifications in the sputtering sequence have been suggested in the prior art, such as, the deposition of an extra Ti layer to sputter away the nitrogen in the nitrided titanium target, returning it to a pure Ti state, thereby reducing the number of chambers being used. However, the use of an extra titanium layer has the disadvantage that if a CVD W layer is deposited on the extra Ti layer using $WF_6$, any free Ti reacts with F to form a layer of TiF, to which W has a bad adhesion. Accordingly, the use of a shutter in the deposition processes of Ti and TiN layers also requires additional processing steps, increases processing time, and increases processing costs.

As the aspect ratio ("AR") of the via increases, i.e., the ratio of the height of the aperture to its width, it has been found that conventional sputtering techniques do not provide acceptable deposition results. As the AR increases, far less material is being deposited at the bottom of the vias than at the top surfaces of the vias, since the sidewalls "shadow" the lower exposed surface. The deposited material at the upper surfaces increasingly accentuates the shadowing effect, thereby prematurely closing the upper section of the via and preventing effective fill of the lower section. For example, with a conventional sputter method, bottom coverage is only about 5% in a via having an AR of 5:1. In order to improve the deposition of Ti and TiN into vias having increased AR, collimation sputtering techniques have been developed in the art.

Collimation techniques having a collimating filter, as known in the art, between the target and the substrate impart greater directionality to the atoms reaching the substrate surface. The use of a collimator allows deposition of Ti and TiN in vias with aspect ratios up to about 2 or 3. However, collimation techniques are inefficient as much of the target material is wasted and builds up on the cell walls of the filter which can lead to an undesired increase in the number of particulates in the system, making it necessary to replace or clean the collimator frequently. Also, since most of the sputtered material does not pass through the collimator and is wasted, the deposition rate is slow and the rate of consumption of the target is high. To overcome such problems, prior art has been aimed at increasing the sputter power in the NM to obtain a practical growth rate, however, when increasing the sputter power it is also necessary to increase the flow rate of nitrogen. This causes the growth rate of the TiN film to be reduced to less than one-third under the same sputter power as compared with the case in which Ti film is formed by such sputtering process.

A collimator can also be used in a NNM process in which $N_2$ gas enters the deposition chamber towards the wafer substrate and is prevented from passing through the collimator towards the target by the flow of Ti atoms. In such a process, it is necessary to exactly balance and control the sputter power and the flow rates of inert Ar and $N_2$ gases, however, such control is difficult and the Ti targets often become nitrided. In either case, a collimator used in either a NM or a NNM mode eventually becomes covered with deposits of Ti and TiN material which tend to flake off the collimator, resulting in contamination of the underlying IC substrate.

Accordingly, it has been recognized that conventional PVD sputtering techniques are inefficient and, in some instances, incapable of providing required directionality to thin films when fabricating VLSI and ULSI circuits. In accordance with standard PVD sputtering devices and techniques, the plasma created lacks a sufficient amount of ionized target material atoms, referred to as plasma intensity. The more intense the plasma, the greater the ability to steer and focus the plasma and thus impart an adequate amount of directionality to the ions in the plasma. The application of RF power to a band of material of the sputtered species, that is the same as the target, was introduced to improve the ability of a sputter source to fill grooves and vias. In so doing, the RF power couples into the neutral plasma and increases the ionization of the neutral atoms. However, the disadvantages with this method is that the band also gets sputtered, and becomes a consumable. Additionally, the sputtering of the band can increase the amount of particles created.

The use of magnetic fields in magnetron sputtering devices has also been introduced in the art to overcome the limitations of conventional PVD sputtering. The magnetic field serves to attract an electron-rich portion of the plasma in the vicinity of the target, whereby the electrons trapped about the target allow for an increase in the collisions between neutral atoms ejected from the surface of the target and the rapidly moving electrons. By increasing the quantity of collisions, the likelihood increases that a neutral ejected target atom will be struck by a sufficiently energetic particle within the plasma, thus causing the ejected target atom to lose one or more electrons and result in an ionized atom. By increasing the quantity of ionized target atoms within the plasma, the plasma density increases and so does the probability that further ionization of ejected target atoms will occur. However, conventional magnetron and rf-iPVD sputtering techniques are limited in their efficiency as the vast majority of metal atoms ejected from the target remain neutral, i.e., upwards of 98% or greater of the target material atoms remain un-ionized as they travel through the sputter chamber to the substrate. As with other PVD techniques, Ti-atoms are ejected from the surface of the sputter target at a random angle and the mean-free path of travel between the target cathode and the substrate for these neutral metal atoms is reduced by random collisions with other target atoms or inert gas ions. When the predominantly neutral atoms in these plasmas do come in contact with the substrate, they characteristically do so over a wide range of angles, generally conforming to a cosine distribution. In particular, when atoms are deposited on substrate surfaces at angles less than normal, it poses significant difficulty in uniformly filling trenches and interconnect vias. Accordingly, the overall efficiency of such systems are very low as most of the sputtered material remains unionized.

A technique that improves directionality of the depositing species and therefore improves the step coverage is ionized PVD (IPVD). Several techniques have been employed to achieve IPVD such as Radio Frequency biased IPVD (RFIPVD), Ion Metal Plasma (IMP), and Hollow Cathode Magnetron (HCM) can be named. However, many of the IPVD sources suffer from the fact that they cannot produce a sufficiently high density plasma that can adequately ionize the depositing metal species. The RFIPVD and IMP IPVD sources produce medium plasma densities in the order $1-5 \times 10^{11}$ particles/cm$^3$. This tends to limit the application of medium density plasma IPVD sources (RFIPVD and IMP) for certain applications including that of Ti and TiN liner and barrier layers in semiconductor processing.

As the critical dimension of semiconductor devices continue to become smaller, the patterned contact or via holes get narrower and deeper, i.e. the aspect ratio of the contacts or vias increase. Standard PVD techniques are proven to be inadequate for depositing films in narrow, high aspect ratio structures with necessary and sufficient step coverage. Accordingly, a need continues to exist in the art for improved methods of depositing Ti liner layers and TiN barrier layers for high aspect ratio of contacts or vias.

Bearing in mind the problems and deficiencies of the prior art, it is therefore an object of the present invention to provide a method of depositing robust Ti liner layers and TiN barrier layers having improved step coverage, grain size, grain orientation and roughness.

Another object of the present invention is to provide a method of depositing Ti liner layers and TiN barrier layers having reduced grain boundaries so that barrier liner performance is not compromised.

It is another object of the present invention to provide a method of depositing conformal Ti/TiN barrier layers within a high aspect ratio opening on a semiconductor wafer such that a metal layer does not diffuse pass the barrier layer.

A further object of the invention is to provide a method of depositing Ti/TiN liner and barrier layers within a single deposition chamber, without the use of a collimator or shutter.

It is yet another object of the present invention to provide a method of depositing Ti/TiN liner and barrier layers having decreased processing steps, time and at reduced costs.

Still another object of the present invention is to provide a method of depositing Ti/TiN liner and barrier layers which imparts increased directionality to the atoms reaching the substrate surface.

Still other objects and advantages of the invention will in part be obvious and will in part be apparent from the specification.

SUMMARY OF THE INVENTION

The above and other objects, which will be apparent to those skilled in the art, are achieved in the present invention which is directed to, in a first aspect, a method of forming a Ti layer and a TiN layer on an integrated circuit substrate in a single PVD deposition chamber without using either a collimator or a shutter. The method includes the steps of providing a hollow cathode target containing titanium whereby the hollow cathode target has a cavity region and providing a substrate attached to an electrostatic chuck within the hollow cathode target. A layer containing Ti is formed on the substrate by sputtering Ti from the target and then a layer containing TiN is formed on the substrate by sputtering Ti from the target while simultaneously flowing a nitrogen-containing gas into the deposition chamber.

In accordance with the first aspect of the invention, an RF bias is applied to the electrostatic chuck to resputter either the layer containing Ti or the layer containing TiN. The step of resputtering may be performed simultaneously during the deposition of either the layer containing Ti on the substrate or the layer containing TiN on the substrate. The resputtering step is performed by applying a negative bias voltage to the electrostatic chuck during the deposition of either the layer containing Ti on the substrate or the layer containing TiN on the substrate.

In a second aspect, the invention relates to a method of forming a Ti layer and a TiN layer on an integrated circuit substrate in a single PVD deposition chamber without using either a collimator or a shutter. The method includes the steps of providing a hollow cathode target containing titanium whereby the hollow cathode target has a cavity region and providing a substrate attached to an electrostatic chuck within the hollow cathode target. A layer containing Ti is formed on the substrate by sputtering Ti from the target. An RF bias is applied to the electrostatic chuck to resputter the layer containing Ti on the substrate. A layer containing TiN is then formed on the substrate by sputtering Ti from the target while simultaneously flowing a nitrogen-containing gas into the deposition chamber. An RF bias is applied to the electrostatic chuck to resputter the layer containing TiN on the substrate.

In accordance with the invention, the steps of forming the layer containing Ti on the substrate and applying an RF bias to the electrostatic chuck to resputter such Ti layer may be performed simultaneously. Likewise, the steps of forming the layer containing TiN on the substrate and applying an RF bias to the electrostatic chuck to resputter such TiN layer may also be performed simultaneously. The semiconductor wafer may have at least one via formed thereon. Preferably, steps of resputtering are performed by applying a negative bias voltage to the electrostatic chuck during the depositions of the layer containing Ti on the substrate and the layer containing TiN on the substrate, respectively. More preferably, the steps of resputtering are performed by applying a RF bias ranging from about 100 Watts to about 500 Watts.

The invention is characterized in that the single deposition chamber does not contain either a collimator or a shutter. The instant method of forming the Ti and TiN layers on an integrated circuit substrate in a single PVD deposition chamber without using either a collimator or a shutter may further include creating a magnetic field having a magnetic null region located between the cavity region and the substrate, heating the substrate to a temperature in a range from about 25° C. to 350° C., and applying a negative volt in a range from about −400 to about −500 volts to the hollow cathode target. The method may still further include applying an amount of power in a range from about 20 to about 36 kilowatts to the hollow cathode target and applying a current not exceeding 1.0 amps to an electromagnetic coil.

Preferably, the hollow cathode target and the substrate are separated by a source-to-substrate spacing from about 86 mm to about 106 mm. Still further, the source-to-substrate spacing may be the same during the depositions of the layer containing Ti on the substrate and the layer containing TiN on the substrate. Alternatively, the source-to-substrate spacing may differ during the depositions of the layer containing Ti on the substrate and the layer containing TiN on the substrate. In the invention, the deposited Ti layer may have a thickness in a range from about 10 nm to about 70 nm, while the deposited TiN layer has a thickness in a range from about 10 nm to about 100 nm.

In still a further aspect of the invention, the invention relates to a method of forming a Ti layer and a TiN layer on an integrated circuit substrate in a single PVD deposition chamber without using either a collimator or a shutter. The method includes the steps of providing a hollow cathode target containing titanium whereby the hollow cathode target has a cavity region and providing a substrate attached to an electrostatic chuck within the hollow cathode target. A layer containing Ti is formed on the substrate by sputtering Ti from the target and simultaneously applying an RF bias to the electrostatic chuck to resputter such layer containing Ti. A layer containing TiN is then formed on the substrate by sputtering Ti from the target while simultaneously flowing a nitrogen-containing gas into the deposition chamber and simultaneously applying an RF bias to the electrostatic chuck to resputter the layer containing TiN. Accordingly, the resputtering of the layers containing Ti and TiN modulates film coverage properties of the layers containing Ti and TiN selected from the group consisting of film thickness, film texture, stoichiometry of the film, layer performance, step coverage, grain size, grain orientation and surface roughness.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–15 of the drawings in which like numerals refer to like features of the invention.

The present invention provides the use of radio frequency (RF) Biased electrostatic chuck ("ESC") to modulate the properties of a titanium (Ti) liner film and a titanium nitride (TiN) barrier film deposited on a wafer surface in the same chamber, without the use of a collimator or a shutter, using a hollow-cathode magnetron ("HCM"). In accordance with the invention, the RF Biased ESC is applied to the wafer to re-sputter and re-deposit the deposited Ti and TiN layers within contact holes causing changes in physical properties of such layers including, for example, step coverage, grain size, grain orientation and roughness. In so doing, the invention improves the subsequent growth rate of a metal layer thereover the TiN barrier film.

In the preferred embodiment, the instant invention adds additional layers of functionality to the PVD deposition of Ti and TiN layers in the same chamber without the use of a collimator or a shutter as disclosed in United States patent application Ser. No. 09/524,987 now U.S. Pat. No. 6,342,133 (U.S. patent application Publication No. US2001/0030125A1), filed Mar. 14, 2000, and assigned to the same assignee as the present application, the disclosure of which is incorporated herein by reference in its entirety. However, as will be recognized by one skilled in the art, the instant invention may be used with a variety of liner and barrier non-collimation and non-shutter deposition techniques used in the art.

Figure 1:
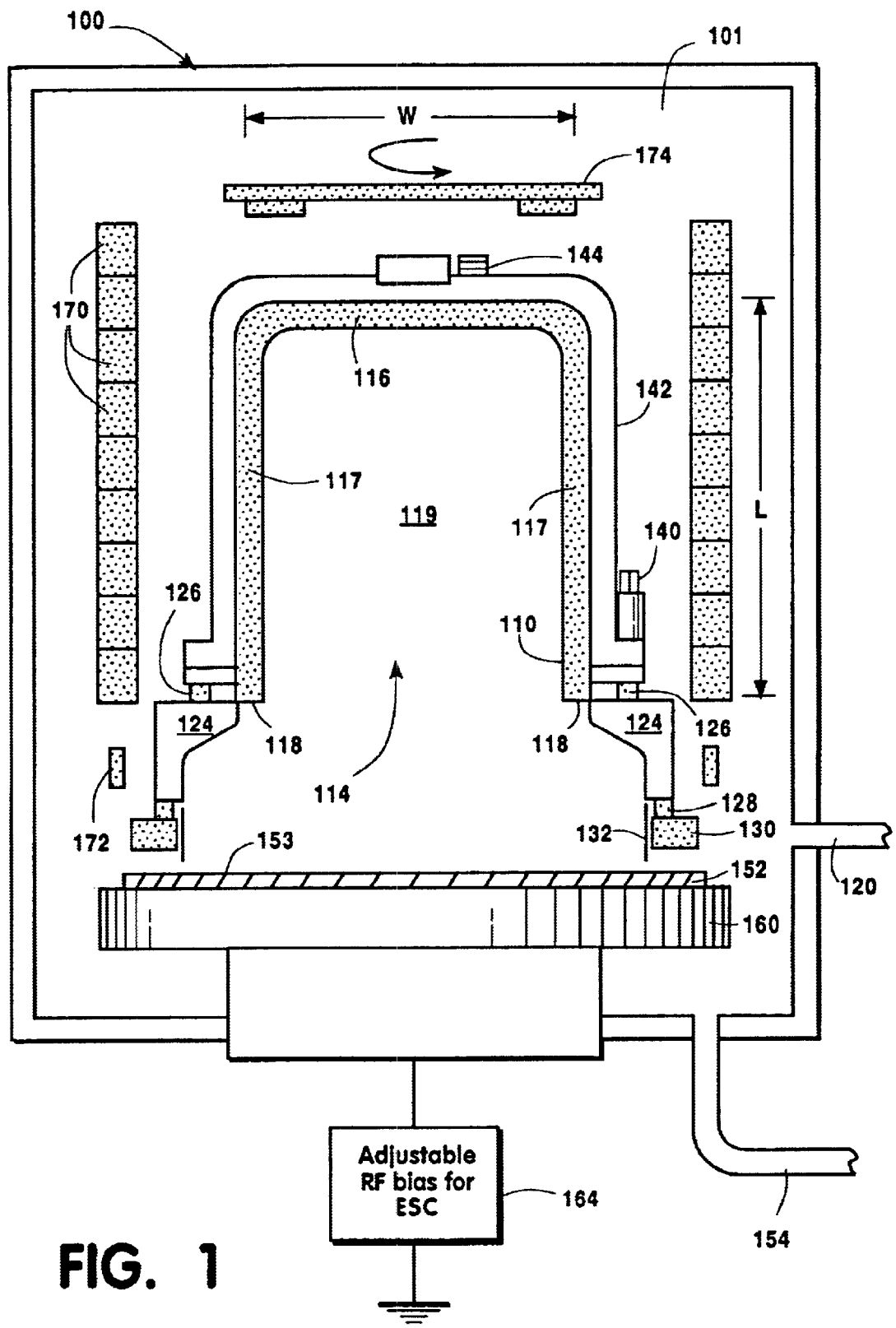
FIG. 1 is a schematic cross-sectional view of a portion of a high-intensity magnetron sputter apparatus having a hollow-cathode magnetron ("HCM") and an RF bias applied to an electrostatic chuck ("ESC") assembly useful in practicing the present invention.

FIG. 1 is a schematic cross-sectional view of a portion of high-intensity magnetron sputter apparatus 100 having a hollow-cathode magnetron (herein after referred to as "HCM") assembly 101, of a type which is useful in practicing the present invention. The Ti/TiN sputter, deposition, resputter and redeposition in accordance with the present invention is a result of a novel application of an HCM and a novel method of operation in this mode within a single deposition chamber.

As illustrated in FIG. 1, HCM assembly 101 includes a hollow target cathode 110 having a hollow cavity region 114 comprising a planar bottom 116 of diameter W, a cylindrical wall 117 of height L from planar bottom 116 to cylindrical end 118, and an opening 119. Width W is preferably less than 2.5 cm and less than L. The hollow target cathode 110 serves as the sputter target for depositing Ti and TiN in NNM and is, therefore, made of titanium. Inert gas inlet 120 is located below the HCM, in the region located adjacent to adapter ring 130 to allow introduction of an inert gas, such as argon, which is used to form a plasma. The plasma formed in HCM sputter apparatus 100 is concentrated within the hollow cavity region 114 of hollow target cathode 110 and, as such, sputtering occurs from within cavity region 114. A floating anode ring 124 is used to create a potential difference with respect to hollow target cathode 110, which may be held at several hundred volts negative, such as, between −400 V and −500 V. The cylindrical ceramic insulator 126 electrically isolates anode 124 from hollow target cathode 110.

HCM assembly 101 also includes adapter ring 130, grounded anode shield 132, and ceramic insulator 128. Anode shield 132 is positioned between the HCM assembly 101 and the substrate surface 153 whereby it functions as a sputtering shield. The anode shield 132 collects errant Ti atoms that are not deposited on substrate surface 153. In so doing, it prevents any errant Ti atoms from depositing on other components of the HCM sputtering apparatus. As such, the anode shield 132 prevents any of such damaging deposits to flake off and enter into the Ti/TiN stack being deposited, and prevents the threat of damaging more costly components of the sputtering apparatus. The HCM assembly 101 further includes a water cooling inlet 140, water cooling outlet 144 and water cooling jacket 142 which prevents overheating of the hollow target cathode 110. During NNM operation, nitrogen-containing gas, typically $N_2$ gas, enters the deposition chamber, but outside of cavity region 114. Nitrogen gas inlet 154 is typically located away from hollow target cathode 110 to prevent nitrogen from reaching the titanium target.

Advantageously, HCM assembly 101 includes an electrostatic chuck ("ESC") 160 substrate holder to which integrated circuit substrate 152 is attached. The electrostatic chuck 160 provides an electrostatic charge clamping the integrated circuit substrate 152 to the chuck without mechanical fasteners. In so doing, the electrostatic chuck allows more surface area of the integrated circuit substrate 152 to be coated with the Ti and TiN layers in comparison to those substrate holder systems which use clamping devices to clamp a portion of the surface of the substrate for securing the substrate to a pedestal. Preferably, the electrostatic chuck 160 is of the tripolar type, having two embedded, electrically isolated, electrodes for the application of a chucking voltage to hold the substrate, while RF bias can be applied to the chuck body by way of the electrostatic chuck electrodes. Electrostatic chuck 160 is connected to an adjustable RF bias power supply 164 through a matching unit (not shown) whereby the RF bias power supply is coupled to the electrostatic chuck through to the embedded electrodes and thus to the wafer. Back side gas can also be provided through a central hole in the electrostatic chuck 160, and a thermocouple may be mounted to the rear of the chuck.

Figure 2:
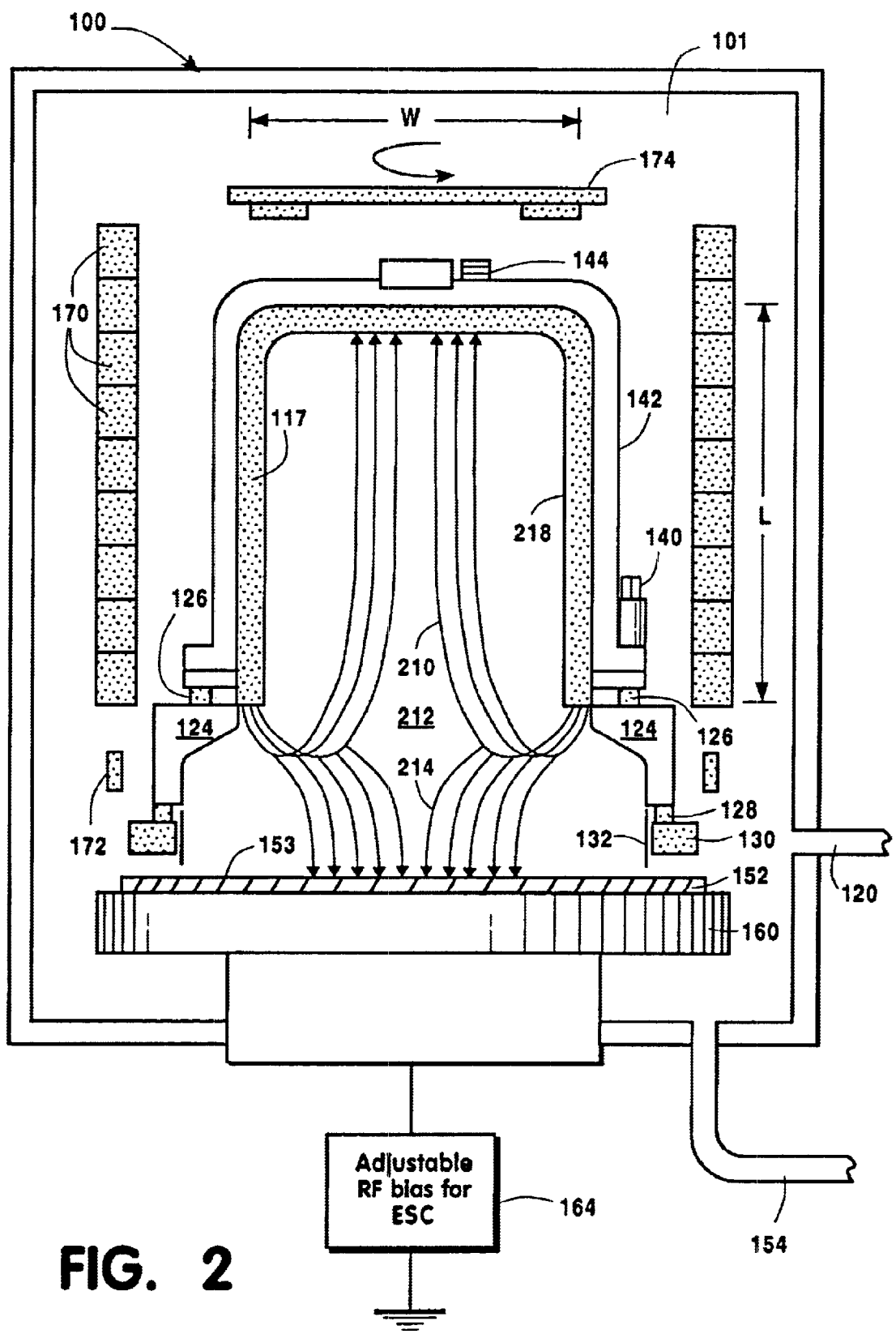
FIG. 2 is a schematic cross-sectional view of FIG. 1 showing ions and electrons leaving the HCM and traveling to the substrate surface for deposition thereto.

As depicted in FIG. 2, HCM assembly 101 further includes stacked annular magnets 170, electromagnetic coil 172, and rotating magnet 174. Stacked annular magnets 170, preferably permanent magnets, create a magnetic field, preferably a permanent magnetic field, having field lines 210 that loop through the side walls 117 and loop around inside of the hollow target cathode 110 so that the magnetic field lines are parallel to the surfaces 218 of walls 117 trapping electrons and ions in the plasma in the vicinity of the hollow target cathode walls 117. Magnets 170 are modified by electromagnetic coil 172 during a deposition method in accordance with the invention in order to improve magnetic field lines 210 and a magnetic null region 212.

The magnetic null-field region 212 is formed immediately outside opening 119 by stacked annular magnets 170. The magnetic null region 212 traps and retains ions and electrons inside the hollow target cathode except for those particles which have entered into the null region 212 at the upper edge 214 of the region 212 with axial velocity and very little radial velocity. The term "axis" herein refers to the axis located at the center of cylindrical hollow target cathode 110, and which is normal to the plane of substrate 152 in FIG. 1, while the term "axial" and related terms herein refer to the direction of the center axis of hollow target cathode towards substrate 152. Ions and electrons which have primarily axial velocity are able to leave the hollow target cathode along the axis at upper edge 214 of null region 212 in FIG. 2 and travel to substrate surface 153 for deposition thereto. Other particles are reflected back and retained in the hollow target cathode.

The HCM assembly 101 is designed to be operated within a vacuum deposition chamber, not shown. The vacuum deposition chamber is evacuated to a sufficiently low pressure, such as, $10^{-5}$ torr or less, and then a small quantity of an inert gas, such as argon, is introduced into the vacuum chamber raising the pressure in the chamber to 1–5 millitorr, for example. In the preferred embodiment, argon is introduced directly into the cathode cavity region 114 via inlet 120 so that it is present in greatest concentration where the plasma discharge is to be initiated, thereby making it is possible to lower the overall system operating pressure. A plasma discharge is then created by applying a high negative voltage on hollow target cathode 110, whereby the plasma is concentrated by the magnetic field lines 210 primarily into an area adjacent to surface 218 of target cathode 110. Gas ions are formed in the plasma and strike the surface of the sputter target cathode, causing neutral Ti-atoms to be ejected from the surface of the target. As the magnetic field moves outward toward opening 119 of cavity region 114, the magnetic field gradually declines until it reaches a point where the magnetic field has completely dissipated; that is, the magnetic null. The magnetic null exists outside of the hollow cavity region 114 of the target cathode 110, a short distance from opening 119 in hollow cathode target 110. It is at this magnetic null region where the plasma that exists in the hollow cathode target is separated from the plasma beam which flows toward the substrate surface 153. Beyond the distance where the magnetic null exists, a remnant reversing magnetic field, $B_{rev}$, exists which typically reaches a maximum of about 50 gauss a short distance from the magnetic null, and then decays asymptotically towards zero as it approaches the surface. If this remnant reversing magnetic field is not counteracted, a small, but potentially damaging, magnetic field may contact the substrate and threaten charging damage.

Electromagnetic coil 172 provides for counteracting the remnant reversing magnetic field and, hence, is useful for the deposition of the Ti and TiN ions. In so doing, the electromagnetic coil 172 is connected to a power supply (not shown in FIG. 1) and is positioned outside the instant HCM deposition chamber at a distance just beyond the magnetic null region so that the opposing or bucking magnetic field that electromagnetic coil 172 generates interacts almost exclusively with the remnant reversing magnetic field. In accordance with the invention, by varying the electrical current supplied to the electromagnetic coil 172, the strength of the magnetic field generated by the coil can be increased or decreased accordingly and, as such, can harness the remnant reversing magnetic field. For example, the coil current can be tuned to almost fully negate the remnant reversing magnetic field, thus allowing a large, almost magnetic-field-free region to exist beyond the magnetic null which, in effect, expands the magnetic null region to allow the plasma beam to diffuse freely in the field free region and achieve superior ion uniformity throughout the diffused plasma beam. Accordingly, the use of a current variable electromagnetic coil is useful when optimization of plasma uniformity is essential, particularly because it allows instantaneously adjusting the spread of the plasma beam, and thus the ion uniformity, while forming the Ti/TiN stack to impart improved step coverage and improved formation of high quality layers of Ti and TiN in comparison to prior art methods and apparatus, such as those which deposit neutral atoms onto the substrate surface. Additionally, by greatly reducing the strength of the remnant magnetic field, the use of a current variable electromagnetic coil lessens the likelihood that the devices on the substrate will be subjected to charging damage.

In addition to the use of a current variable electromagnetic coil for optimization of the plasma uniformity for depositing the Ti/TiN stack, an RF bias is simultaneously applied to the ESC 160 through the embedded electrodes, and thus to the substrate 152 attached thereto ESC 160, to both of the sequentially deposited Ti and TiN layers. In accordance with the invention, Ti and TiN layers are deposited on the substrate 152 using the instant single chamber HCM simultaneously in combination with the RF bias being applied to ESC 160 to resputter and redeposit each of the sequentially deposited Ti and TiN layers to advantageously modulate the film coverage properties, such as, altering film thickness, altering film texture, altering stoichiometry of the film, improving layer performance, improving step coverage, decreasing grain size thereby reducing grain orientation and creating more randomly oriented grains with fewer grain boundaries, decreasing surface roughness, and the like. The instant invention advantageously redistributes the Ti and TiN layers within contact holes in the substrate by simultaneously increasing the film coverage at the bottom of the contact holes, i.e., increasing the bottom coverage ("BC"), and increasing the film coverage on the sidewalls of the contact holes, i.e., increasing sidewalls coverage ("SC").

In the instant invention, the HCM source generates the argon atom containing plasma which is directed toward and extends down to the substrate surface. At the same time, an RF bias is applied to ESC 160 to increase the energy of the argon atoms near the substrate while simultaneously increasing the negative DC potential of the substrate. A higher negative DC potential on the substrate creates a larger potential difference between the plasma and the substrate. This higher negative potential on the substrate "attracts" the positively charged Ti+ atoms, causing an increase in the amount of Ti material that gets deposited at the bottom of the vias. Secondly, the increased potential differential between the bulk of the plasma and the substrate causes the $Ar^+$ ions, having an increased kinetic energy, to accelerate toward and directly bombard the horizontal surfaces of the substrate causing Ti ions from the deposited layer to be resputtered and redeposited on the substrate surface thereby altering the above discussed coverage properties of the Ti layer. Wherein the substrate is provided with contact holes, the Ti layer is deposited therein the contact holes and the Ar+ ions, having increased kinetic energy, accelerate toward the bottom of the contact holes and directly bombard the deposited material at the bottom of the contact holes. The Ar+ ion bombarded Ti layer at the bottom of the contact hole is resputtered and redeposited within the contact hole either directly back onto the bottom of the contact hole, as shown in FIG. 3, or onto the sidewalls of the contact hole, which are parallel to the ion bombardment, as shown in FIG. 4. Wherein the Ti layer at the bottom of the contact hole or via is resputtered and redeposited onto the sidewalls of the contact hole, the bottom coverage ("BC") is simultaneously increased along with the sidewalls coverage ("SC").

In accordance with the invention for depositing Ti and TiN on an integrated circuit substrate, first the Ti liner layer is sputtered and deposited in a non-nitrided mode ("NNM") and simultaneously resputtered and redeposited onto the substrate by applying an RF bias voltage to the ESC, thereby improving coverage features of the Ti liner layer. In so doing, a hollow cathode target having a cavity region and containing titanium is provided and titanium from the target is sputtered to form a layer containing Ti on the substrate. In depositing the Ti layer, an amount of power in a range of from 20 to 36 kilowatts may be applied to the target, thereby creating a negative voltage in a range of from −350 to −500 volts at the hollow cathode target while simultaneously applying a current not exceeding 1.0 amps to an electromagnetic coil to modify the magnetic field. While depositing the Ti layer onto the substrate surface, an RF bias having a power ranging from about 50 Watts to about 500 Watts is simultaneously applied to ESC 160 to increase the energy of Ar+ ions which bombard substrate 152 at its horizontal surfaces thereby increasing the resputtering and redeposition of the deposited Ti layer to modulate the film coverage properties.

After the Ti liner layer has been simultaneously sputtered, deposited, resputtered and redeposited onto the substrate surface, the TiN barrier layer is then simultaneously sputtered, deposited, resputtered and redeposited onto the substrate surface in the same manner and under the same conditions as described above in relation to the Ti layer. In depositing the TiN layer, Ti is sputtered from the target and simultaneously a nitrogen-containing gas is flowed into the single deposition chamber to form a layer containing TiN on the substrate over the Ti layer of the invention. Simultaneously, an RF bias having a power ranging from about 50W to about 500 W is applied to the ESC 160 to resputter and redeposit the TiN layer. During the depositions of both the Ti and TiN layers in accordance with the invention, the substrate may be heated to a temperature in a range of from 25° C. to 350° C. Additionally, in accordance with the invention, both the Ti and TiN layers may be deposited on the substrate with different source to substrate distances, i.e., the substrate can be moved to different positions for the Ti and TiN depositions. Alternatively, the Ti and TiN layers may be deposited on the substrate at a fixed source to substrate distances, i.e., at the same source to substrate distances. Further, the RF bias applied during the depositions of the Ti and TiN layers may be the same, or alternatively, the RF bias applied during deposition of the Ti layer may differ from the RF bias applied during deposition of the TiN layer.

In accordance with the invention, the use of a current variable electromagnetic coil is particularly useful for the deposition of Ti and TiN layers because it allows instantaneously adjusting the spread of the plasma beam, and thus the ion uniformity, while forming the Ti/TiN stack thereby providing the ability to impart improved step coverage and improved formation of high quality layers of Ti and TiN in comparison to prior art methods and apparatus such as those which deposit neutral atoms onto the substrate surface. In addition to the use of a current variable electromagnetic coil, the simultaneous use of an RF bias applied to an ESC during the sequential depositions of both the Ti and TiN layers for resputtering and redepositing such Ti/TiN layers provides for further improved step coverage, grain size, grain orientation, and roughness of the deposited Ti/TiN layers in comparison to prior art techniques and apparatus.

Accordingly, by imparting directionality to the Ti-ions in the plasma by the sputtering developed in the HCM, i.e., the Ti-ions in the plasma being directed towards the substrate in a more perpendicular fashion, in combination with the acceleration of such Ti-ions directed towards the substrate by applying an RF bias to the ESC, an overall improvement in sputtering and resputtering operations is seen in the ability to impart the proper step coverage and trench-filling in high AR vias and trenches, as opposed to the random impingement of prior art sputtering and resputtering mechanisms dominated by neutral particles. While Ti-ions deposited in accordance with the invention are much more energetic than neutral atoms deposited using prior art sputtering techniques, they are not so energetic as to cause damage to the substrate. Particularly, ions having an energy of less than approximately 100 ev do not cause damage to the wafer substrate. This damage-causing level is well above the energy of the ions deposited using the present invention.

The instant high intensity plasma developed in the HCM, which typically has a density of $10^{13}$ particles/cc, along with the application of the RF bias to the ESC, is sufficiently intense to cause ionization of not only the gas atoms, but also of a large number of the sputtered Ti-atoms. The high intensity of the present invention is created in part by the ability of the HCM, in combination with the RF bias applied to the ESC within the instant HCM, to increase the Ti-ion count well beyond previous magnetron sputtering devices used for Ti/TiN deposition. The sputtering and resputtering developed in the HCM is predominantly of Ti-ions, rather than neutral particles, and these ionized particles are far more inclined to being steered and/or focused to the substrate surface.

Figure 3A:
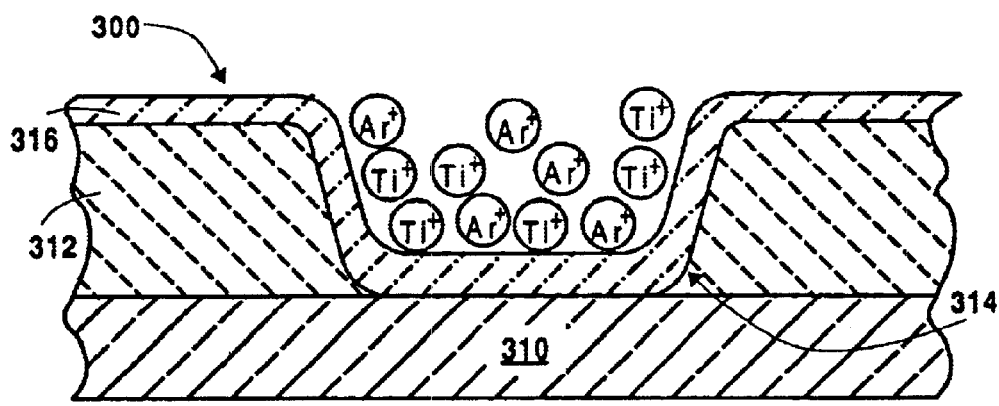
FIG. 3 depicts an IC portion comprising a via having a Ti/TiN barrier layer fabricated using a method in accordance with the invention.
Figure 3B:
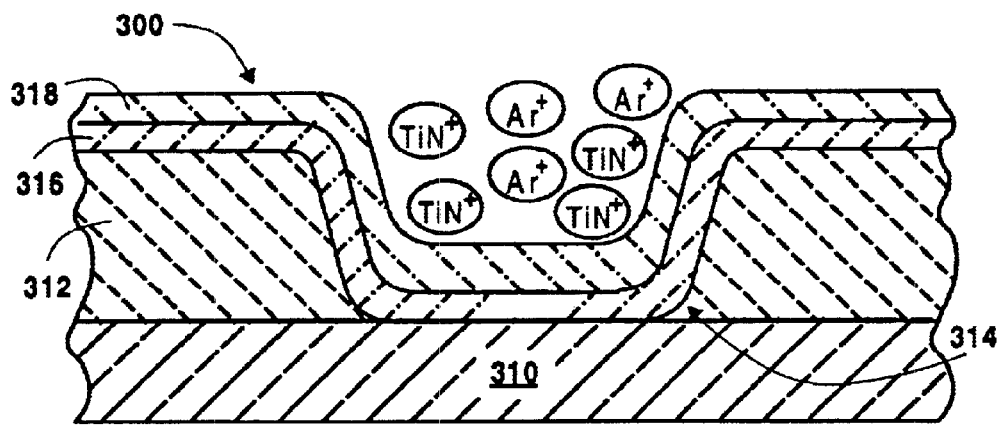
Figure 3C:
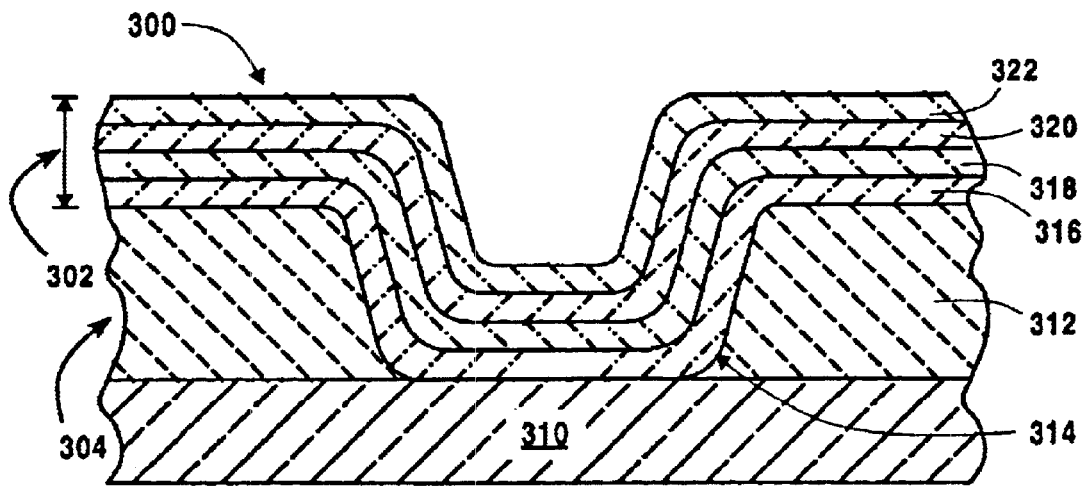

FIGS. 3A–C depict a process flow for creating an integrated circuit portion 300 containing a layered stack 302 having Ti and TiN layers that may be fabricated on a wafer 304 using a method in accordance with the invention. IC portion 300 comprises wafer substrate 310, typically comprising single crystalline silicon, but which may comprise other semiconductor or conductive materials. Insulator layer 312 typically comprises an oxide layer, such as $SiO_x$, but it may also comprise other insulator material, such as in an ILD. The insulator layer 312 has contact hole 314 extending down to the surface of wafer substrate 310. As shown in FIG. 3A, the Ti contact layer 316 is deposited in contact hole 314 in contact with wafer substrate 310 in accordance with the instant invention. As shown in FIG. 3A, as the Ti layer 316 is deposited in the contact hole, the bottom coverage of Ti layer 316 is larger than the sidewalls coverage. In accordance with the invention, simultaneously, an RF bias is applied to the ESC to increase the energy of Ar+ ions and to increase the negative DC potential on the substrate. The Ar+ ions bombard the layer 316 at its horizontal surfaces, thereby altering both the bottom coverage and the sidewalls coverage within the contact hole, while the higher DC potential draws more positively charged Ti ions into the hole. In so doing, as the Ar+ ions, having increased energy, bombard the substrate surface, Ti ions are released, i.e., resputtered, from the bottom surface of the contact hole, thereby changing the bottom coverage, and redeposited onto the sidewalls of the contact hole, thereby increasing the sidewalls coverage. The reduction in the bottom coverage due to the re-sputtering by the Ar+ ions is more than compensated by the increased bottom coverage due to the increase in bottom coverage due to the higher negative potential obtained on the substrate due to the RF bias. Next, as illustrated in FIG. 3B, the TiN layer 318 is deposited over the resputtered Ti layer as described above in relation to the deposition of such Ti layer. As shown in FIG. 3C, the RF bias applied to the ESC increased the energy of Ar+ ions which bombarded the TiN layer 318 at its horizontal surfaces, thereby altering both the bottom coverage and the sidewalls coverage within the contact hole of the TiN layer 318. Subsequently, a conducting layer 320, typically an Al alloy metallization layer, is disposed on TiN barrier layer 318, followed by a TiN anti-reflective coating ("ARC") layer 322 covering the conducting layer 320.

Figure 4A:
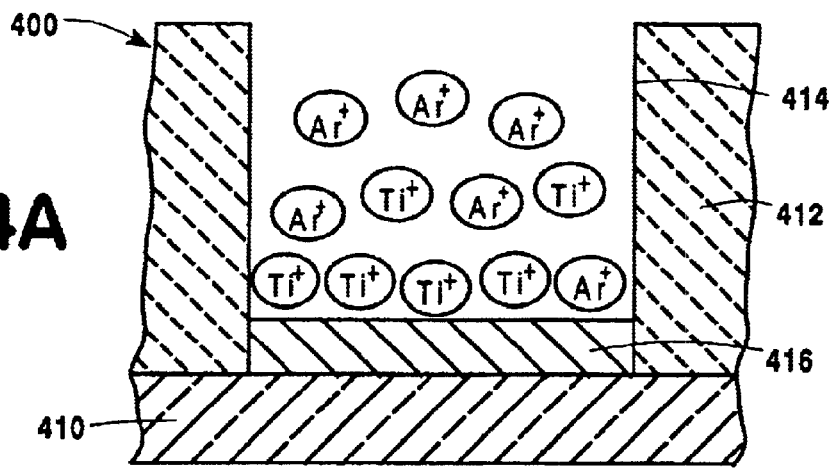
FIG. 4 depicts an IC portion comprising a via having a Ti liner layer and a TiN barrier layer fabricated using a method in accordance with the invention.
Figure 4B:
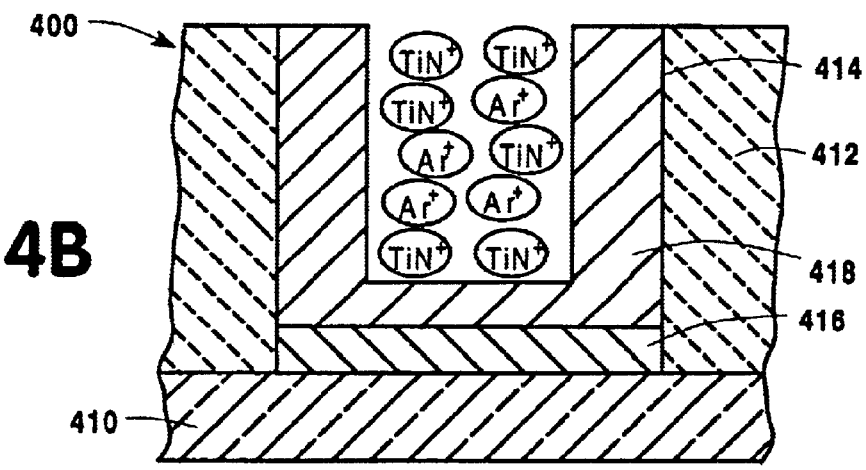
Figure 4C:
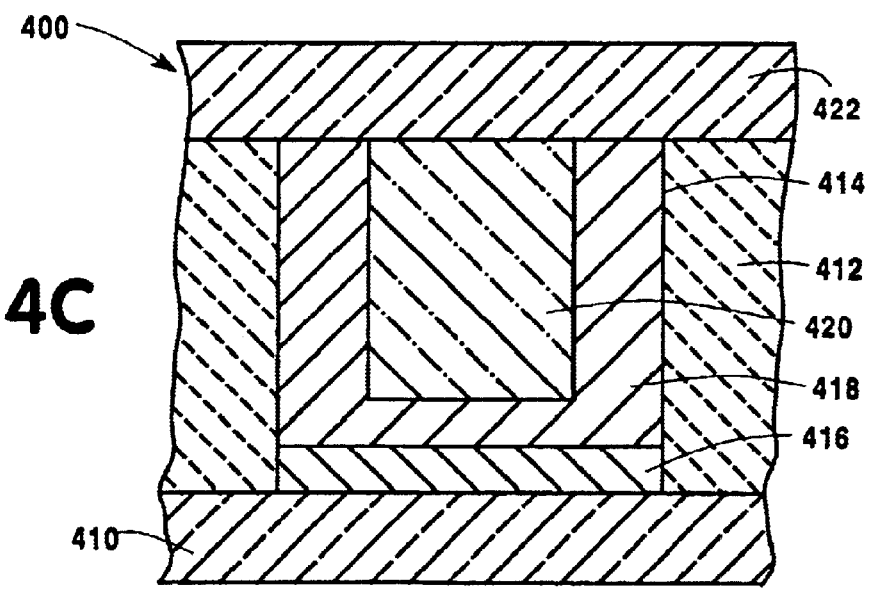

Likewise, in FIGS. 4A–C, the Ti layer may be deposited as a liner layer in a via 414 of an IC portion 400 to only coat the bottom surface of such via 414. In so doing, the IC portion 400, which may comprise a conductive or semiconductive substrate 410 on which insulating layer 412 is disposed, is provided with a Ti liner layer 416 at the bottom of the via 414 in accordance with the instant invention. The Ti liner layer 416 is simultaneously resputtered in accordance with the invention to alter the coverage properties of such deposited Ti liner layer 416. Subsequently as shown in FIG. 4B, a TiN barrier layer 418 is deposited within the via 414 having a larger bottom coverage in comparison to sidewall coverage. The TiN barrier layer 418 is simultaneously resputtered in accordance with the invention to alter the coverage properties of such deposited TiN barrier layer 418 as well as decrease the bottom coverage while at the same time increase the sidewall coverage. A tungsten plug 420 is then provided within the via 414 to provide electrical connection through via 414 between substrate 410 and conductive layer 422. Advantageously, the instant invention redistributes the Ti and TiN layers within contact holes in the substrate by increasing the film coverage at the bottom of the contact holes due to the higher negative potential, i.e., reducing bottom coverage, and increasing the film coverage on the sidewalls of the contact holes, i.e., by re-sputtering.

In certain embodiments of the invention, the hollow target cathode and the substrate may be separated by a distance ranging from about 86 mm to about 106 mm. This source-to-substrate spacing ("SSS") is the distance from a point that is 100 mm below the end 118 of hollow target cathode 110 and substrate 152. Thus a SSS spacing of 86 mm would correspond to 186 mm from location of end of 118 to substrate 152. A method in accordance with the invention may be used to sputter, deposit, resputter and redeposit layers of Ti and TiN having thicknesses up to several microns, the final thickness being limited by the amount of Ti target material. In typical integrated circuit fabrication, however, the thickness of a Ti layer formed is typically in a range of from 10 to 70 nm, and the thickness of a TiN layer formed is typically in a range of from 10 to 100 nm.

Figure 5:
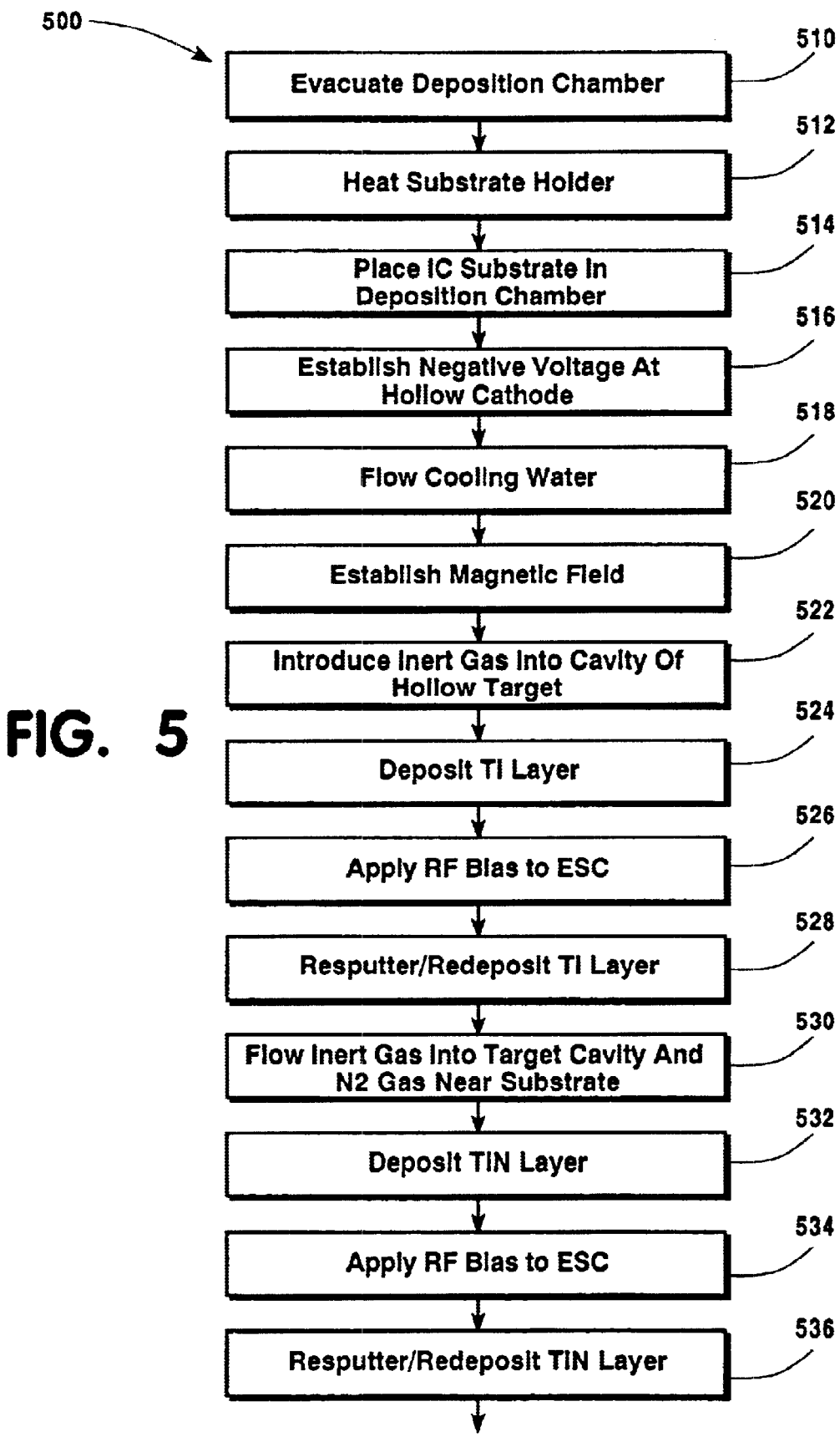
FIG. 5 is a process flow sheet of a generalized method in accordance with the invention for forming Ti and TiN layers in the same deposition chamber using the same Ti target in a NNM, without use of either a collimator or a shutter.

FIG. 5 shows a process flow sheet of a generalized method in accordance with the invention for forming a Ti layer and a TiN layer in the same deposition chamber using the same Ti target in a NNM, without use of either a collimator or a shutter, and resputtering and redepositing the deposited Ti and TiN layers to provide improved step coverage, grain size, grain orientation, and roughness of such Ti and TiN layers. The method of flowsheet 500 is described here with reference to FIGS. 1, 2 and 4, although it is understood that methods in accordance with the invention may be applied to a large variety of structures using a variety of HCM assemblies without departing from the inventive concepts. Also, the order of some of the process steps as outlined in FIG. 5 may be changed.

In step 510 of generalized method 500, the deposition chamber is evacuated down to a sufficiently low pressure, for example, $10^{-5}$ torr or less. In step 512, ESC 160 is heated to a "stage" temperature, typically in a range of from about 25° C. to about 350° C., preferably about 300° C. In step 514, the substrate wafer to be processed is placed on ESC 160 so that it is heated up to or near the stage temperature. The source-to-substrate spacing (SSS), that is, the distance from a point that is 100 mm below the end 118 of hollow target cathode 110 and substrate 152 is in a range from about 86 mm to about 106 mm, preferably about 106 mm for Ti and for TiN. Thus a SSS spacing of 86 would correspond to 186 mm from location of end of 118 to substrate 152. In step 516, a negative DC voltage, typically in a range of from −400 V to −500 V, is applied to hollow target cathode 110. The power applied to the HCM apparatus is typically in a range of from 20 to 36 kW, and preferably about 30 kW. In step 518, cooling water is flowed at sufficient temperature and flow-rate to maintain the temperature of the target cathode during the deposition process in a range of 65° C. to 95° C. In step 520, a DC current in a typical range of from 0 to 1 amps ("A"), preferably about 0.25 amps, at about 80–120 volts is flowed through electromagnetic coil 172 to influence magnetic field lines 210 and magnetic null region 212, as described above.

Next, in step 522, inert plasma-forming gas, such as argon, is introduced into the evacuated deposition chamber at a flow-rate in a range of from about 90 to about 135 sccm which raises the pressure in the chamber from about 1 to about 5 millitorr, for example. The argon gas is introduced directly into cavity region 114 through inlet 120 so that it is present in greatest concentration where the plasma discharge is to be initiated. A plasma discharge is created as a result of the high negative voltage on hollow target cathode 110. The plasma is concentrated by the magnetic field lines 210 primarily into an area adjacent to a surface of target cathode 110. Gas ions are formed in the plasma and strike the surface of the sputter target cathode, causing neutral Ti-atoms to be ejected from the surface of the target. Neutral Ti-atoms are converted to Ti-ions through electron-removing collisions with other gas atoms in the plasma. Ti-ions having a velocity substantially normal to the plane of substrate 152 exit the cavity region 114 through magnetic null region 212 and impinge on substrate surface 153, forming a Ti layer as depicted by step 524.

Simultaneously, in step 526, an RF bias in the range of about 100 watts to about 500 watts, preferably about 300 watts, is applied to ESC 160 to generate a table bias of about 20 volts to about 60 volts, thereby increasing the DC potential of the substrate, while simultaneously increasing the energy of the argon atoms near the substrate. The Ar+ ions accelerate toward and directly bombard horizontal surfaces of the substrate causing Ti ions from the Ti deposited layer to be resputtered and redeposited on the substrate surface thereby altering coverage properties of the Ti layer in step 528. The combined deposition/redeposition rate of the Ti layer is typically greater than 90 nm/min. As a result, deposition of a Ti liner layer 416 with a typical thickness of nm in step 524 is completed in about 17 seconds.

Figure 6:
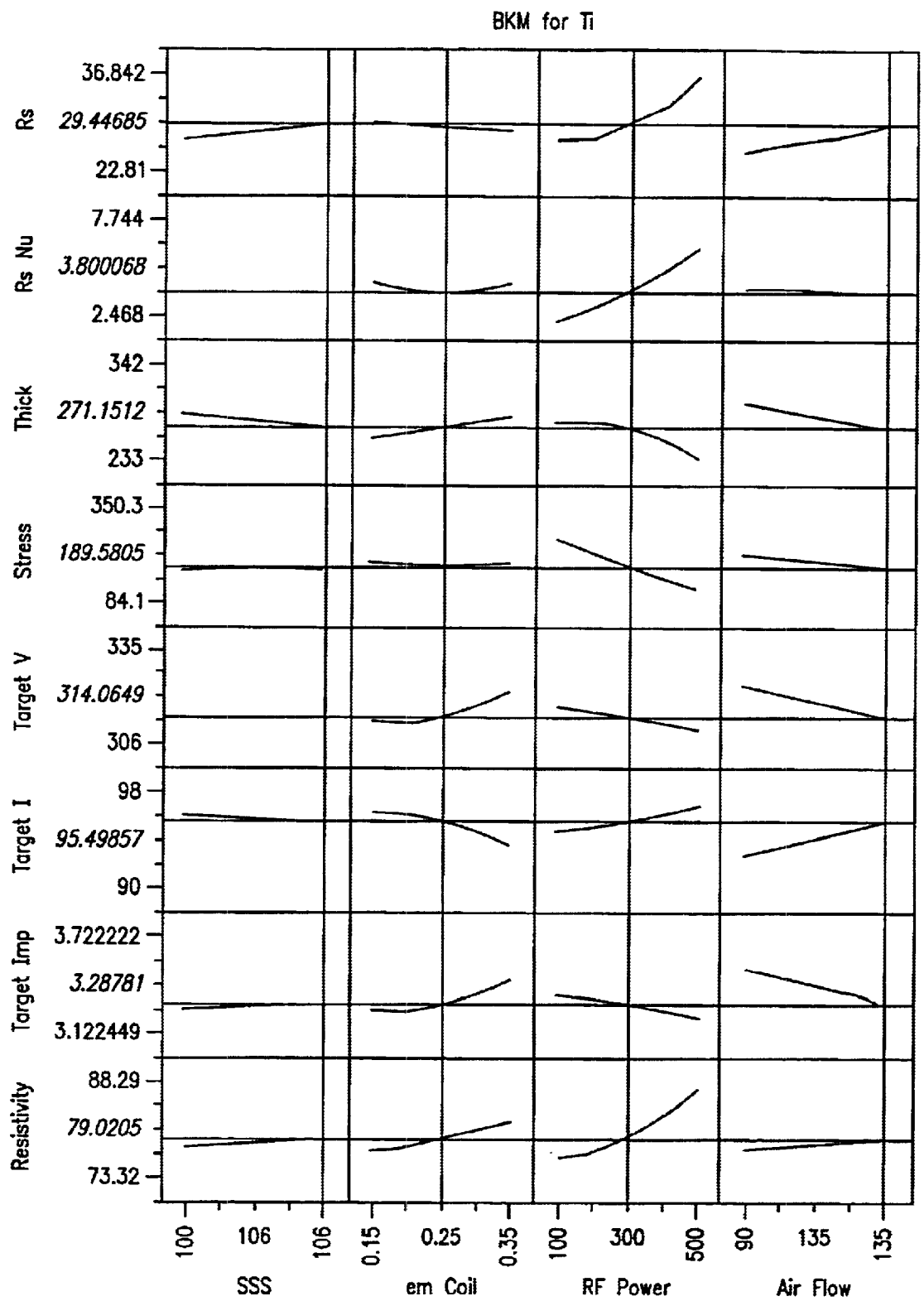
FIG. 6 shows a Best Known Method ("BKM") model for the deposition of the Ti layer in accordance with the generalized method of FIG. 5.

FIG. 6 shows a Best Known Method ("BKM") model for the Ti deposition whereby the source-to-substrate spacing ("SSS") is about 106 mm, ESC 160 is heated to about 300° C., DC current is about 0.25 amps, the power applied to HCM about 30 kW, argon flow-rate is about 135 sccm, and RF bias applied to ESC 160 is about 300 watts. As shown, by applying the RF bias applied to ESC for resputtering the deposited Ti layer, advantageously, film coverage properties including, for example, resistivity, target impedance ("V/I"), target current ("Ti"), target voltage ("TV"), stress, thickness, sheet resistance non-uniformity ("Rs Nu"), and sheet resistance ("Rs"), of the Ti layer are improved over prior art techniques. Unexpectedly, the demonstrated expected performance of the resultant Ti layer has an Rs non-uniformity of less than 4% 1 σ, a deposition rate of greater than 90 nm/min, and a bottom coverage of greater than 40% for an aspect ratio of 6:1.

After the Ti layer has been sputtered, deposited, resputtered, and redeposited, the TiN layer may then be deposited thereover such Ti layer. In step 530, the DC current flowed through electromagnetic coil 172 is preferably about 0.25 A at about 80–120 volts. To begin deposition of TiN, $N_2$ is flowed into the deposition chamber near the substrate through nitrogen gas inlet 154 at a flow-rate typically in a range of from about 24 sccm to about 32 sccm, preferably about 28 sccm. Inert gas flow into cavity region 114 is typically increased during TiN deposition from its value during Ti-deposition steps 522 and 524. When argon gas is used, its flow-rate is in a range of from about 90 sccm to about 135 sccm, preferably about 135 sccm. In step 532, nitrogen atoms combine with Ti-ions at the substrate, forming a TiN layer. Simultaneously, in step 534, an RF bias in the range of about 100 watts to about 500 watts, preferably about 300 watts, is applied to ESC 160 to generate the above table bias while simultaneously increasing the energy of the argon atoms. The $Ar^+$ ions bombard the substrate surface causing Ti ions from the TiN deposited layer to be resputtered and redeposited on the substrate surface thereby altering coverage properties of the TiN layer in step 536. The combined deposition/redeposition rate of the TiN layer is typically greater than 65 nm/min. As a result, deposition of a TiN barrier layer 418 with a typical thickness of 50 nm in step 526 is completed in about 54 seconds. During deposition step 530, the DC current flowed through electromagnetic coil 172 is preferably about 0.19 A at about 80–120 volts.

C., the DC current is about 0.19 amps, the power applied to HCM about 30 kW, the argon flow-rate is about 135 sccm, the nitrogen flow-rate is about 28 sccm and the RF bias applied to ESC 160 is about 500 watts. As shown, by applying the RF bias applied to ESC for resputtering the deposited TiN layer, advantageously, the above discussed film coverage properties of the Ti layer are also improved over prior art techniques. Unexpectedly, the demonstrated expected performance of the resultant TiN layer has a sheet resistance non-uniformity of less than 4% 1 σ, a deposition rate of greater than 65 nm/min, a bottom coverage of greater than 60% for an aspect ratio of 6:1 and a sidewall coverage of greater than 13% at the bottom corner.

EXAMPLE 1

A TiN/Ti stack was sputtered, deposited, resputtered and redeposited on a series of planar integrated circuit wafers, each having a $SiO_x/Si$ substrate, in accordance with the invention. The TiN/Ti stacks were formed in the same HCM deposition chamber using the same titanium hollow target cathode in accordance with the invention without using a collimator or a shutter. The preferred operating conditions as discussed with reference to FIG. 5 were used. Rutherford Back Scattering ("RBS") and X-ray Diffraction ("XRD") measurements were conducted on an intermediate wafer and the results are demonstrated, respectively, in Tables 1 and 2 below.

TABLE 1

RBS RESULTS
(Surface N/Ti, at center "C" and edge "E")

| RF for TiN | N | Ti | N/Ti | Density (at/cc) |
|---|---|---|---|---|
| 0 RF | 50.0 - C | 50.0 - E | 1.0 - C | 1.0 E 23 |
|  | 51.5 - E | 48.5 - E | 1.06 - E | 1.0 E 23 |
| 100 RF | 50.0 - C | 50.0 - E | 1.0 - C | 1.05 E 23 |
|  | 51.5 - E | 50.0 - E | 1.0 - E | 1.00 E 23 |
| 200 RF | 49.0 - C | 51.0 - C | 0.96 - C | 1.02 E 23 |
|  | 49.0 - E | 51.0 - E | 0.96 - E | 1.02 E 23 |
| 300 RF | 49.0 - C | 51.0 - C | 0.96 - C | 1.02 E 23 |
|  | 49.0 - E | 51.0 - E | 0.96 - E | 1.02 E 23 |
| 400 RF | 50.0 - C | 50.0 - E | 1.0 - C | 1.00 E 23 |
|  | 50.0 - E | 50.0 - E | 1.0 - E | 1.03 E 23 |

TABLE 2

XRD Results
(XRD of Ti/TiN stack at center "C" and edge "E")

| Sample | Peak Area (a.u) | | | FWHM (□, 2 Theta) | |
|---|---|---|---|---|---|
| RF for TiN | TiN (111) | Ti (002) | Ti (o11) | TiN (111) | Ti (002 & 011) |
| 0 RF | 5620 - C | 5444 - C | 1869 - C | 0.377 - C | 0.75 - C |
|  | 6181 - E | 6197 - E | 1849 - C | 0.365 - E | 0.628 - E |
| 100 RF | 3860 - C | 4344 - C | 2527 - C | 0.477 - C | 0.889 - C |
|  | 4704 - E | 5037 - E | 2400 - E | 0.424 - E | 0.770 - E |
| 200 RF | 3891 - C | 3513 - C | 2251 - C | 0.416 - C | 0.889 - C |
|  | 4877 - E | 4449 - E | 2208 - E | 0.374 - E | 0.783 - E |
| 300 RF | 2355 - C | 3997 - C | 2438 - C | 0.902 - C | 0.892 - C |
|  | 3180 - E | 5002 - E | 2427 - E | 0.725 - E | 0.804 - E |
| 400 RF | 3766 - C | 4526 - C | 2368 - C | 0.550 - C | 0.932 - C |
|  | 4767 - E | 5307 - E | 2541 - E | 0.443 - E | 0.785 - E |

Figure 7:
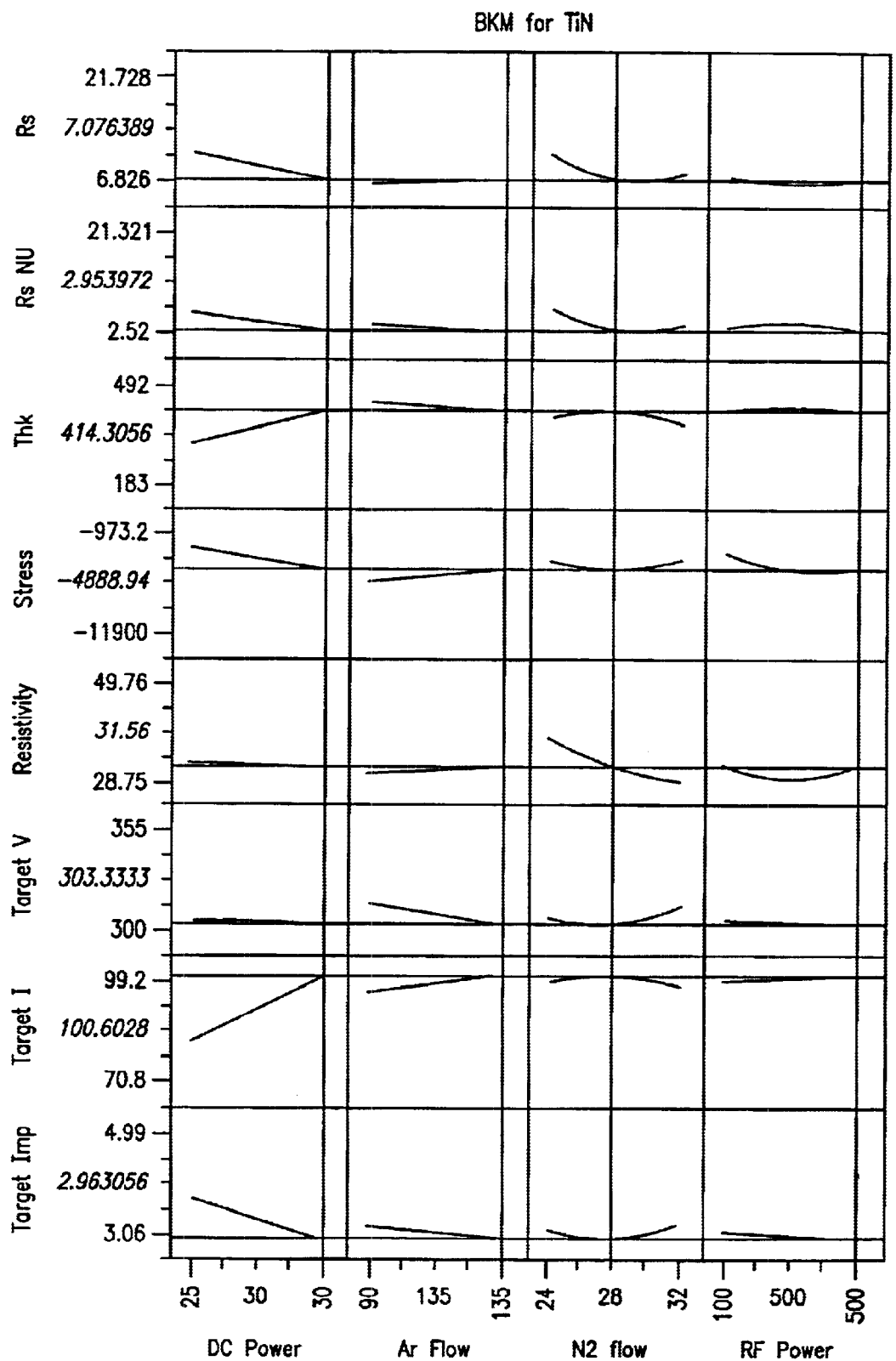
FIG. 7 shows a Best Known Method ("BKM") model for the deposition of the TiN layer in accordance with the generalized method of FIG. 5.

FIG. 7 shows a Best Known Method ("BKM") model for the TiN deposition whereby the source-to-substrate spacing ("SSS") is about 106 mm, ESC 160 is heated to about 400°

In both Tables 1 and 2 above, the Ti and TiN layers were deposited under the following conditions according to the generalized method of FIG. 5. In depositing the Ti layer, the SSS is about 106 mm, ESC 160 is heated to about 300° C., the DC current is about 0.25 amps, the power applied to HCM about 30 kW, the argon flow-rate is about 90 sccm, and the RF bias applied to ESC 160 is 0 watts. In depositing the TiN layer, the SSS is about 106 mm, ESC 160 is heated to about 300° C., the DC current is about 0.19 amps, the power applied to HCM about kW, the argon flow-rate is about 135 sccm, the nitrogen flow-rate is about 28 sccm and the RF bias applied to ESC 160 is between 0 watts and 400 watts.

As demonstrated in Table 1, in accordance with the results of the RBS measures of the Ti and N in the Ti/TiN layers, at a low RF, nitrogen is higher on the edge of the wafer, while at an RF of between 200 to 300 Watts the layers are slightly N deficient, and still further at an RF of 400 Watts the center and the edge are identical, i.e., N/Ti is equal to 1. Accordingly, for the TiN layer, it is critical that the ration of the N/Ti be equal to 1. The results of the RBS measures of the Ti and N in the Ti/TiN layers are used to characterize the film itself. Further, for the Ti/TiN stack, it is critical that the Ti layer does not contain any nitrogen. In accordance with the instant invention, it has been shown that the Ti and TiN depositions can be run sequentially within the same chamber without any risk of nitrogen contaminating a Ti deposition process which is run after the deposition of the TiN layer.

Table 2 shows a measure of the full with half maximum ("FWHM"), i.e., the measure of the orientation of a grain, whereby the smaller the FWHM measure, the more strongly oriented the grain. In accordance with the results of the XRD measures of the FWHM, it is shown that the maximum FWHM for the TiN layer is at an RF of 300 Watts at which the edge of the substrate is more strongly oriented than the center of the substrate. That is, the FWHM of the TiN increases, showing that the peak is less strongly oriented, leading to more randomly oriented grains. This is critical since the TiN layer is a barrier layer and prevents the diffusion of $WF_6$, used during the deposition of VCD W, into the underlying Ti layer. The more randomly oriented the grains, the better the barrier layer in comparison to those barrier layers having strongly oriented grains, i.e., the $WF_6$ diffuses more easily along the boundaries of the strongly oriented grains than it does along the boundaries of randomly oriented grains. Additionally, as shown in Table 2, the RF bias applied to the ESC during the TiN deposition changes the FWHM of the Ti deposited layer.

Figure 8:
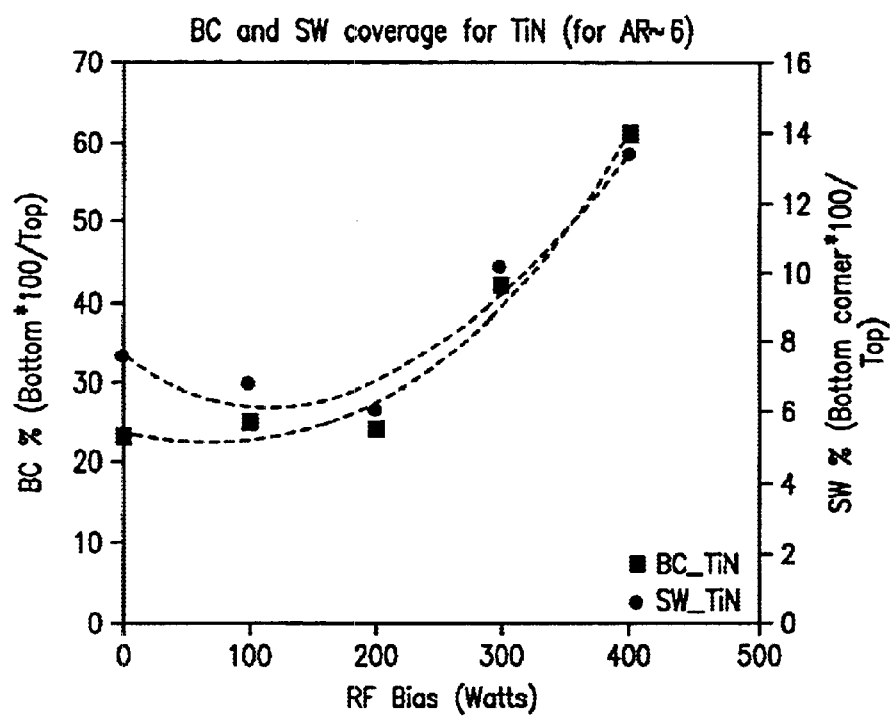
FIG. 8 shows a graph of the Bottom Coverage ("BC") and Sidewall Coverage ("SC") for the TiN layer deposited according to the generalized method of FIG. 5 for an aspect ratio of 6:1.

FIG. 8 illustrates a graph of the Bottom Coverage and Sidewall Coverage for the TiN layer deposited under the conditions as described above in relation to Tables 1 and 2 for an aspect ratio of 6:1. According to FIG. 8, the RF bias must reach a certain critical level to draw down additional Ti to the bottom of the via, thus leading to higher bottom coverage. As shown, an increase in the RF bias leads to re-sputtering of the deposited layers from the bottom of the via to the sidewalls of the via, thereby increasing the sidewall coverage. For example, the Ti layer may be deposited at an RF bias of 300 Watts for a high BC with a minimum SW coverage and a high deposition rate to compensate for a lower TiN deposition rate.

Figure 9:
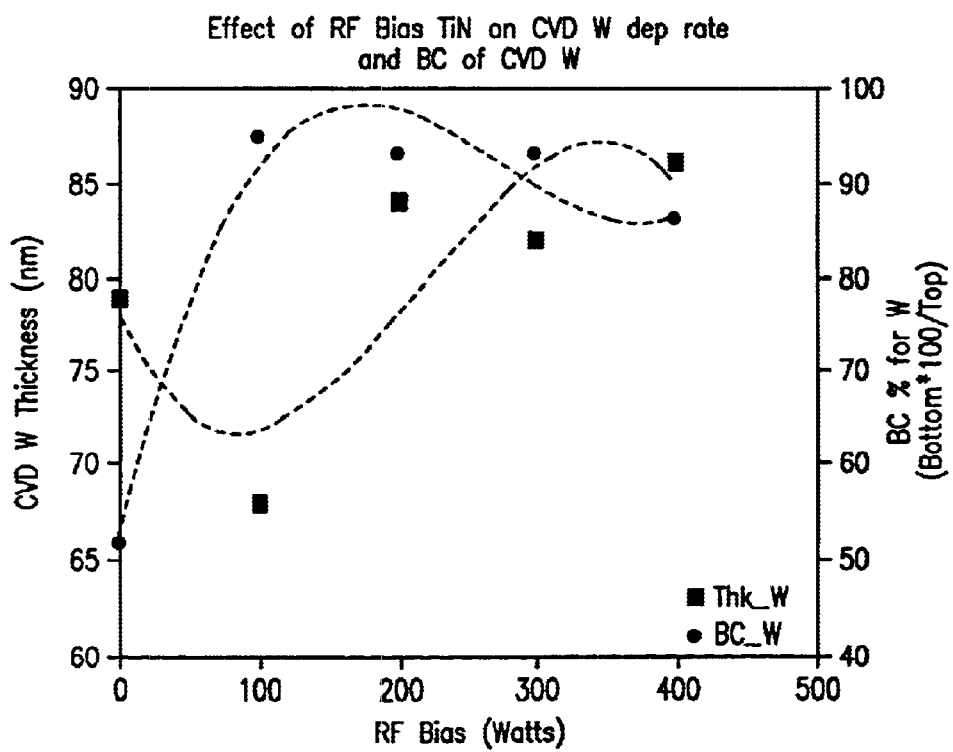
FIG. 9 shows a graph of the Effect of the RF bias during deposition of the TiN layer deposited according to the generalized method of FIG. 5 on the deposition rate of a CVD tungsten layer and the Bottom Coverage ("BC") of such CVD tungsten layer.

Advantageously, in depositing Ti liner layers and TiN barrier layers in accordance with the instant invention provides for improved subsequent growth rate of a chemical vapor deposition tungsten (CVD-W) layer on the TiN barrier film. FIG. 9 shows a graph of the Effect of the RF bias during deposition of the TiN layer deposited under the conditions as described above in relation to Tables 1 and 2 on the deposition rate of a CVD tungsten layer and the Bottom Coverage ("BC") of such CVD tungsten layer. In so doing, FIG. 9 shows that the application of an RF bias in accordance with the invention increases the CVD W nucleation at the bottom of the via, as demonstrated the change in BC % of deposited W. Further, it is shown that the RF bias for the instant HCM deposition of the TiN layer affects the subsequent growth rate of the CVD W.

Figure 10:
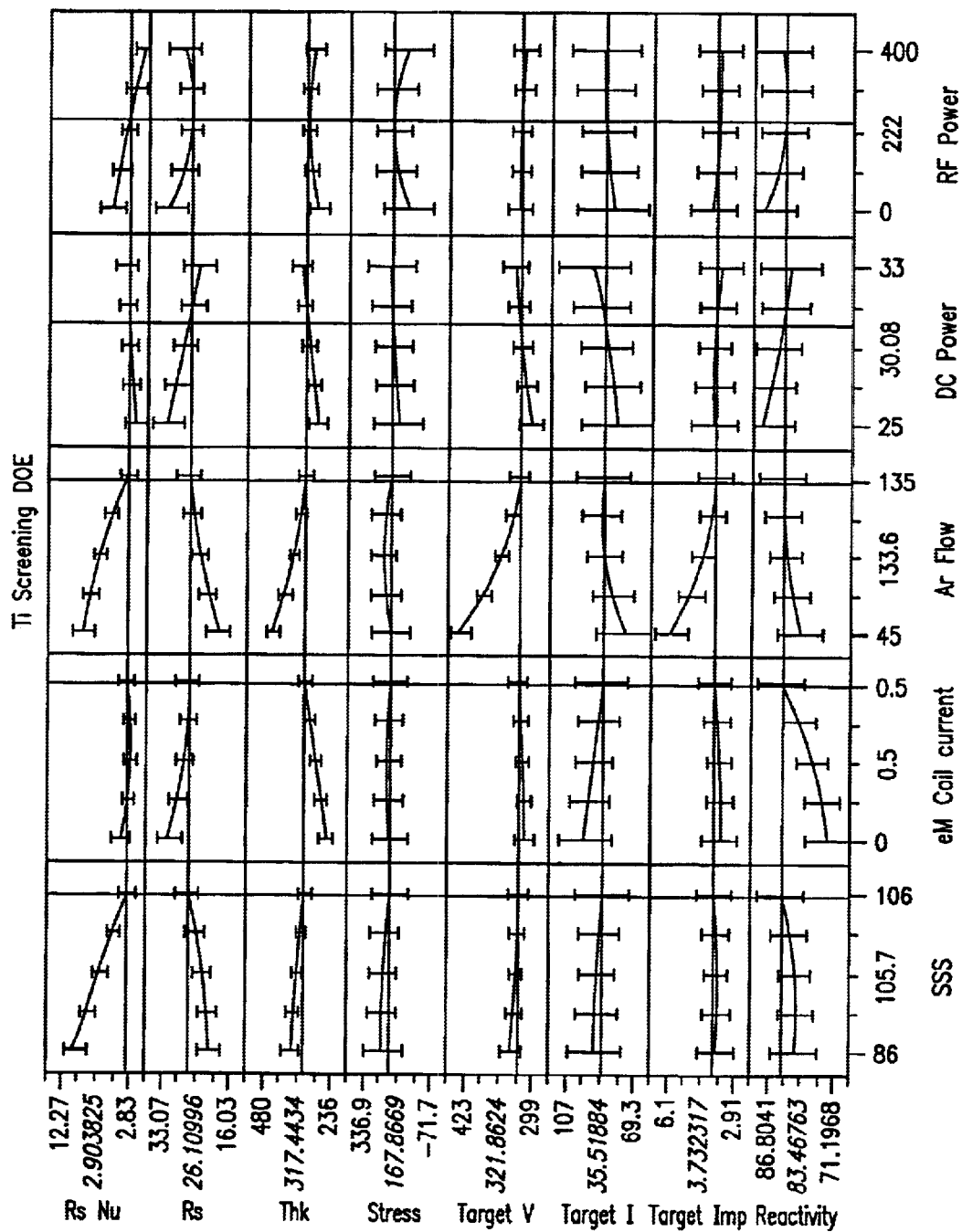
FIGS. 10–12 illustrate a Design of Experiments Model ("DOE") and Parameter Interactions for Rs for the deposition of the Ti Layer according to the generalized method of FIG. 5.
Figure 11:
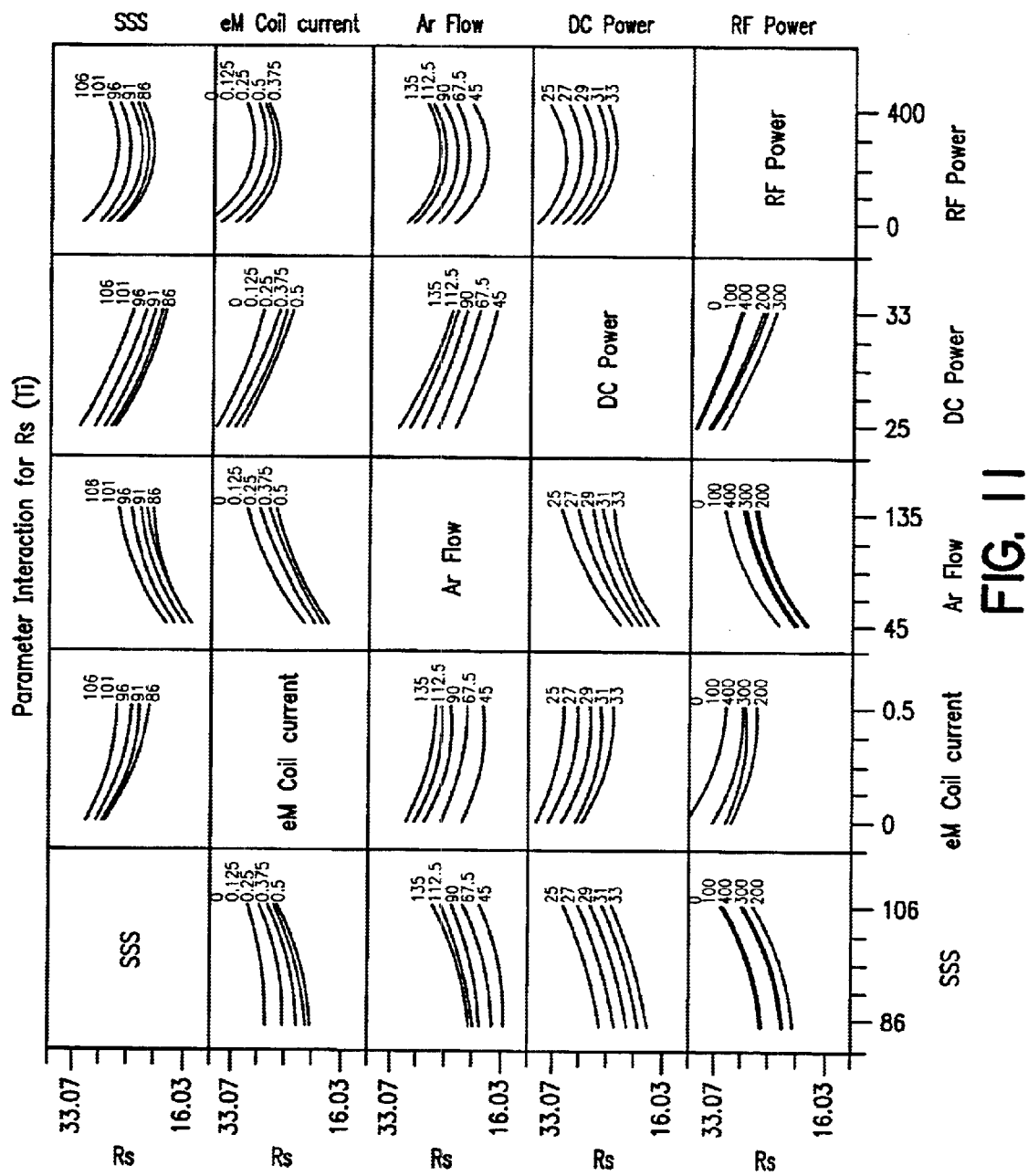
Figure 12:
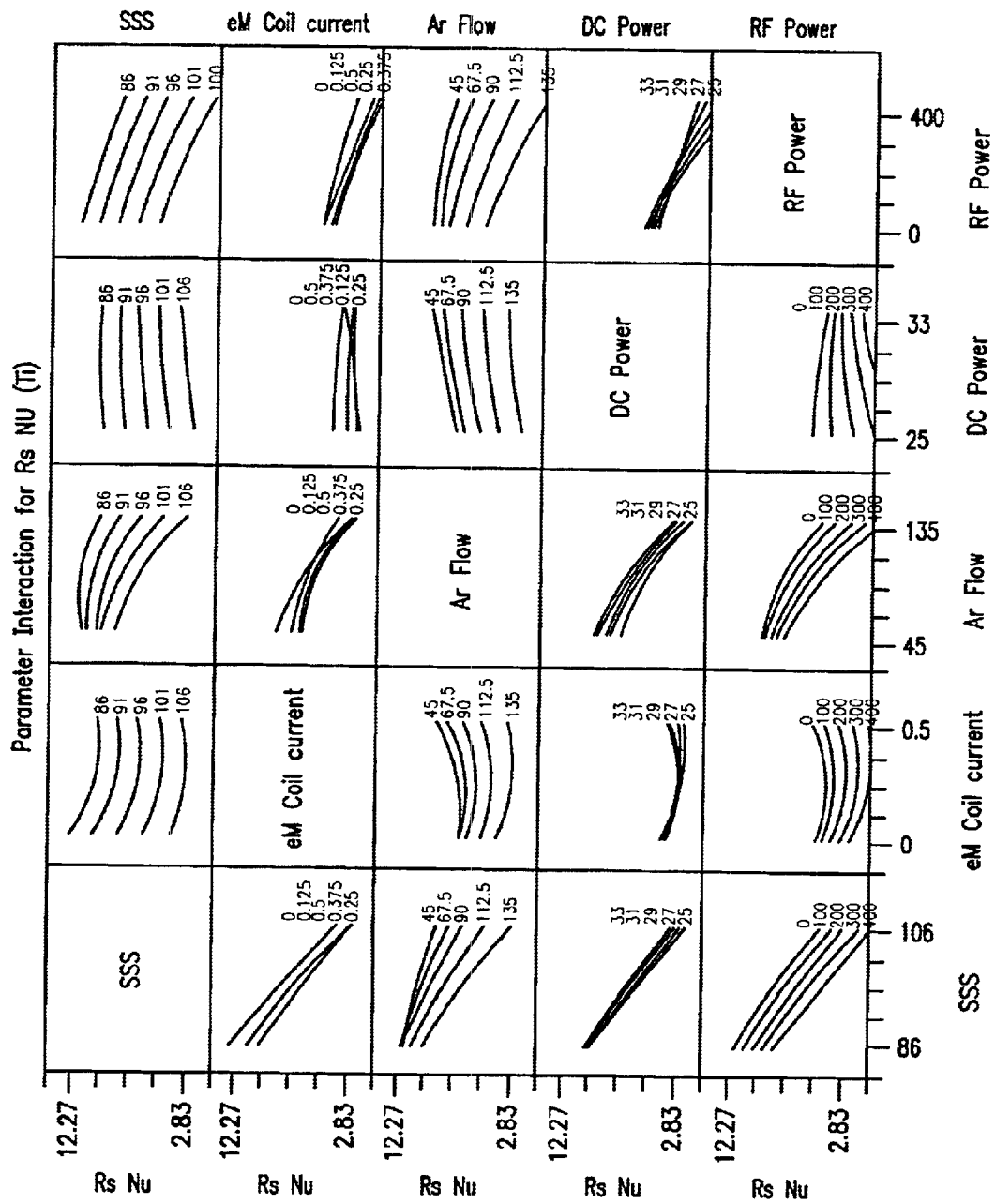
Figure 13:
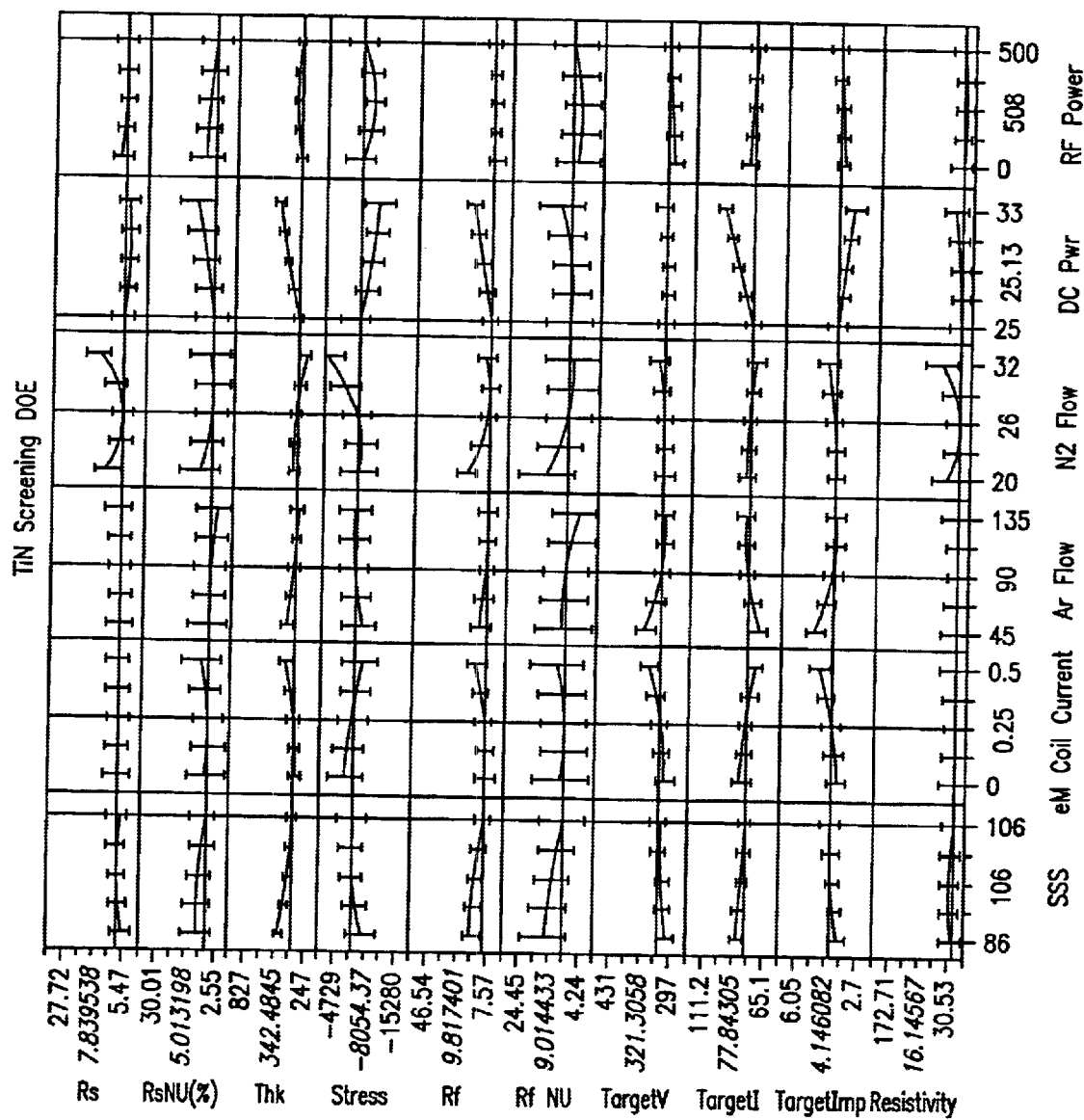
FIGS. 13–15 illustrate a Design of Experiments Model ("DOE") and Parameter Interactions for Rs for the deposition of the TiN Layer according to the generalized method of FIG. 5.
Figure 14:
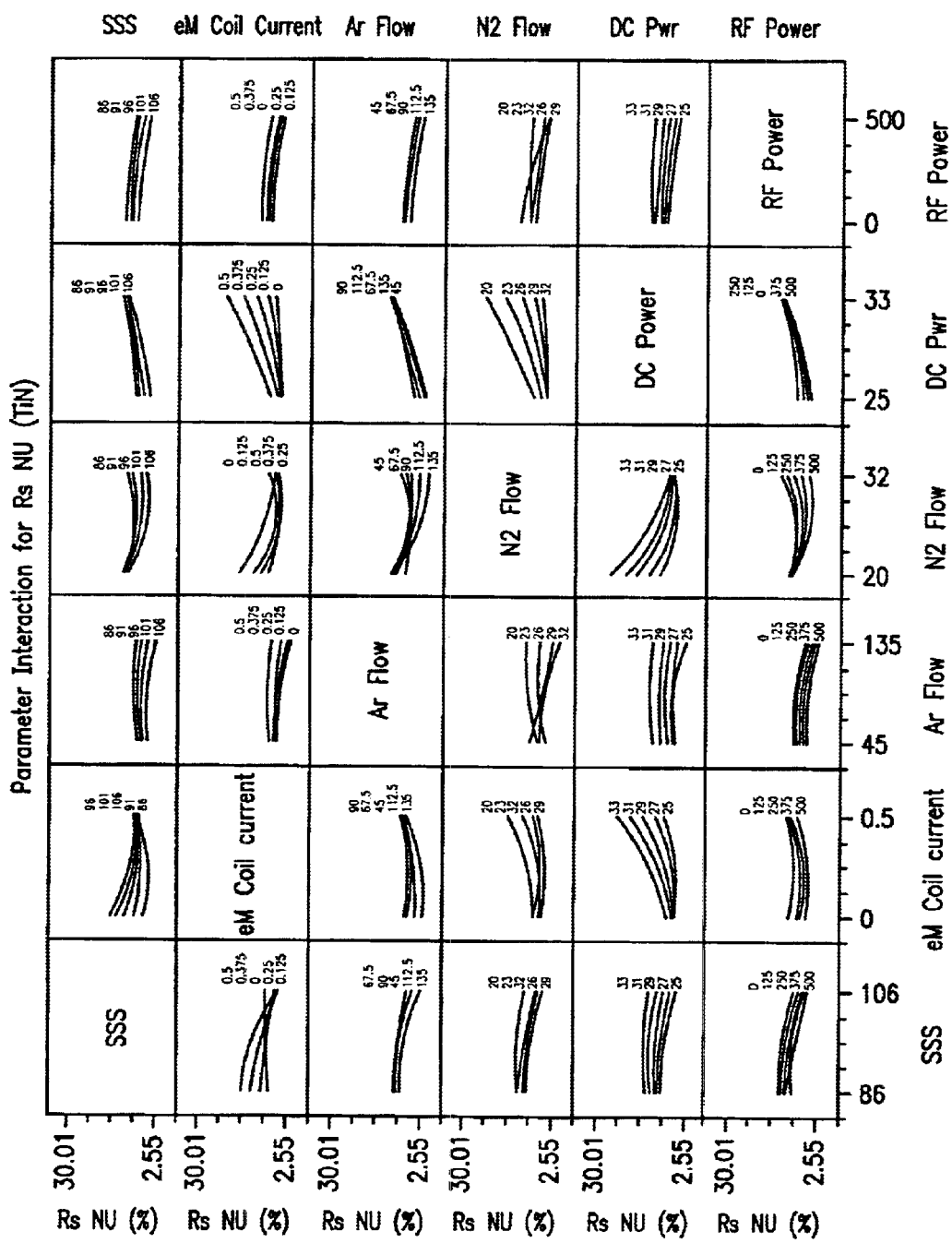
Figure 15:
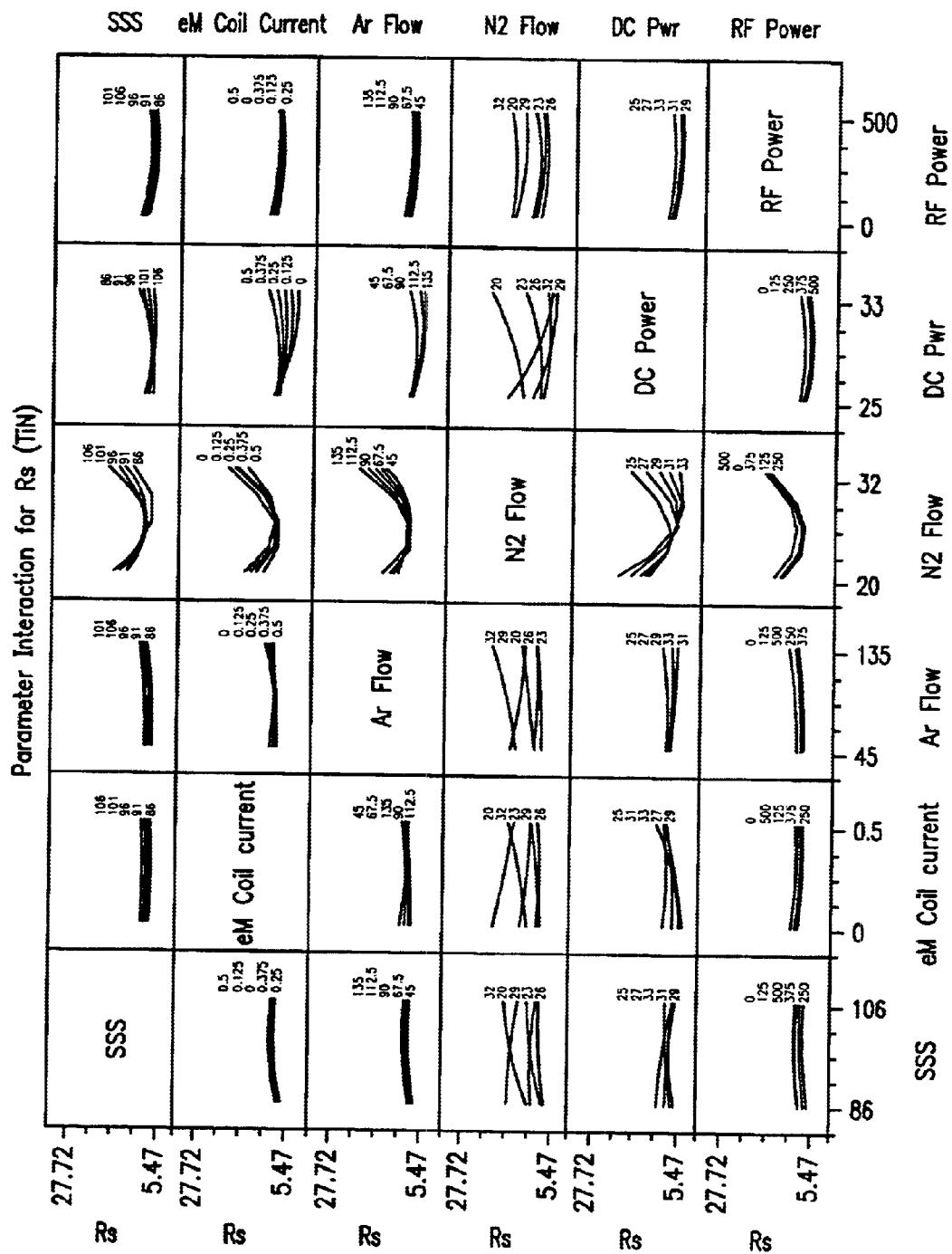

Additionally, FIGS. 10–12 and 13–15 illustrate Design of Experiments Models ("DOE") and Parameter Interactions for Rs for the deposition of Ti and TiN Layers in accordance with the instant invention. As will be recognized by one skilled in the art, any individual box within the DOE models of FIGS. 10 and 13 shows a univariate response of the y axis with changes in the x axis. The various x-axis variables show the various "knobs" that can be tuned to adjust the process. The range of the x axis variables (for e.g., SSS 86 nm to 106 nm) is the range process window that the SSS can be tuned through. Likewise, the Parameter Interactions for Sheet Resistance ("Rs") as shown in FIGS. 11 and 12 for the deposition of the Ti layer and in FIGS. 14 and 15 for the deposition of the TiN layer, illustrate that any individual box shows the interaction of the x axis variable with the secondary y axis variable, and the result is plotted on the first y axis variable (Rs). As will be recognized by one skilled in the art, the different lines within any given box shows that the range of the secondary y axis was tested parameter.

There has been described a novel method for depositing Ti and TiN layers on an integrated circuit substrate in the same PVD chamber using the same titanium target in NNM in combination with an RF biased electrostatic chuck to modulate the properties of the deposited Ti and TiN layers in the same chamber, without use of either a shutter or a collimator. The resulting Ti and TiN layers are superior in step coverage, grain size, grain orientation, roughness and uniformity such that subsequent filling of the high aspect ratio opening is substantially void-free. The deposition rates of the Ti and TiN layers is faster than in apparati and methods of the prior art. For example, NNM operation in accordance with the invention provides deposition rates of 65 nm/min or more and step coverage greater than 35% percent while fabricating a TiN layer in a via having an aspect ratio ("AR") of 6:1, i.e., top opening of 0.25 micron, in comparison to processes utilizing collimators which provide SC of 5–10% for the same structure.

A method in accordance with the invention is particularly useful for filling vias and contact holes having high aspect ratios. The novel method uses a hollow-cathode magnetron technique. It should be understood that the particular embodiments shown in the drawings and described within this specification are for purposes of example and should not be construed to limit the invention, which will be described in the claims below. It is also evident that the steps recited may, in some instances, be performed in a different order; or equivalent structures and processes may be substituted for the structures and processes described. Consequently, the invention is to be construed as embracing each and every novel feature and novel combination of features present in and/or possessed by the fabrication methods and compositions described.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a Ti layer and a TiN layer on an integrated circuit substrate in a single PVD deposition chamber without using either a collimator or a shutter, comprising the steps:
    (a) providing a hollow cathode target containing titanium, said hollow cathode target having a cavity region;
    (b) providing a substrate within said chamber under said hollow cathode target, said substrate attached to an electrostatic chuck;
    (c) forming a layer containing Ti on said substrate by sputtering Ti from said target within said cavity region;
    (d) forming a layer containing TiN on said substrate by sputtering Ti from said target within said cavity region while simultaneously flowing a nitrogen-containing gas into said deposition chamber outside of said cavity region thereby preventing said nitrogen-containing gas from reaching said hollow cathode target and avoiding any risk of nitrogen contaminating a subsequent Ti deposition process performed after the deposition of the layer containing TiN on said substrate; and
    (e) applying an RF bias to said electrostatic chuck to resputter at least one of said layer containing Ti on said substrate of step (c) or said layer containing TiN on said substrate of step (d),
wherein said RF bias is applied to said electrostatic chuck to increase an energy of an inert gas near a surface of said substrate thereby imparting directionality to Ti+ atoms from said plasma for deposition of said Ti and TiN layers on said substrate.

2. The method of claim 1 wherein step (e) is performed simultaneously during the deposition of said at least one of said layer containing Ti on said substrate of step (c) or said layer containing TiN on said substrate of step (d).

3. The method of claim 1 wherein step (e) is performed by applying a negative bias voltage to said electrostatic chuck during the deposition of said at least one of said layer containing Ti on said substrate of step (c) or said layer containing TiN on said substrate of step (d).

4. A method of forming a Ti layer and a TiN layer on an integrated circuit substrate in a single PVD deposition chamber without using either a collimator or a shutter, comprising the steps:
    (a) providing a hollow cathode target containing titanium within said chamber, said hollow cathode target having a cavity region and said chamber having an electromagnetic coil;
    (b) providing a substrate within said chamber under said hollow cathode target, said substrate attached to an electrostatic chuck;
    (c) sputtering Ti from said target to form a layer containing Ti on said substrate;
    (d) applying an RF bias to said electrostatic chuck to resputter said layer containing Ti on said substrate while applying a current not exceeding 1.0 amps to said electromagnetic coil;
    (e) sputtering Ti from said target and simultaneously flowing a nitrogen-containing gas into said deposition chamber to form a layer containing TiN on said substrate; and
    (f) applying an RF bias to said electrostatic chuck to resputter said layer containing TiN on said substrate while applying said current not exceeding 1.0 amps to said electromagnetic coil.

5. The method of claim 4 wherein step (c) is performed simultaneously with step (d).

6. The method of claim 4 wherein step (e) is performed simultaneously with step (f).

7. The method of claim 4 wherein steps (d) and (f) are performed by applying a negative bias voltage to said electrostatic chuck during the depositions of said layer containing Ti on said substrate and said layer containing TiN on said substrate, respectively.

8. The method of claim 4 wherein steps (d) and (f) are performed by applying a RF bias ranging from about 100 Watts to about 500 Watts.

9. The method of claim 4 wherein step (b) comprises providing a semiconductor wafer having at least one via formed thereon.

10. The method of claim 4 wherein said Ti and TiN layers are deposited into openings within said substrate, wherein said openings are selected from the group consisting of contact holes, vias and trenches.

11. The method of claim 4, further comprising creating a magnetic field, said magnetic field having a magnetic null region located between said cavity region and said substrate.

12. The method of claim 4, further comprising heating said substrate to a temperature in a range from about 25° C. to 350° C.

13. A method of forming a Ti layer and a TiN layer on an integrated circuit substrate in a single PVD deposition chamber without using either a collimator or a shutter, comprising the steps:
    (a) providing a hollow cathode target containing titanium within said chamber, said hollow cathode target having a cavity region;
    (b) providing a substrate within said chamber under said hollow cathode target, said substrate attached to an electrostatic chuck;
    (c) sputtering Ti from said target to form a Ti layer on said substrate by applying a negative volt in a range from about −400 to about −500 volts to said hollow cathode target;
    (d) applying an RF bias to said electrostatic chuck to resputter said Ti layer on said substrate;
    (e) sputtering Ti from said target by applying said negative volt to said target and simultaneously flowing a nitrogen-containing gas into said deposition chamber to form a TiN layer on said substrate; and
    (f) applying an RF bias to said electrostatic chuck to resputter said TiN layer on said substrate.

14. A method of forming a Ti layer and a TiN layer on an integrated circuit substrate in a single PVD deposition chamber without using either a collimator or a shutter, comprising the steps:
    (a) providing a hollow cathode target containing titanium within said chamber, said hollow cathode target having a cavity region;
    (b) providing a substrate within said chamber under said hollow cathode target, said substrate attached to an electrostatic chuck;
    (c) sputtering Ti from said target to form a Ti layer on said substrate by applying an amount of power in a range from about 20 to about 36 kilowatts to said hollow cathode target;
    (d) applying an RF bias to said electrostatic chuck to resputter said Ti layer on said substrate;
    (e) sputtering Ti from said target by applying said power and simultaneously flowing a nitrogen-containing gas into said deposition chamber to form a TiN layer on said substrate; and (f) applying an RF bias to said electrostatic chuck to resputter said TiN layer on said substrate.

15. A method of forming a Ti layer and a TiN layer on an integrated circuit substrate in a single PVD deposition chamber without using either a collimator or a shutter, comprising the steps:
   (a) providing a hollow cathode target containing titanium within said chamber, said hollow cathode target having a cavity region;
   (b) providing a substrate within said chamber under said hollow cathode target, said substrate attached to an electrostatic chuck;
   (c) sputtering Ti from said target to form a layer containing Ti on said substrate;
   (d) applying an RF bias to said electrostatic chuck to resputter said layer containing Ti on said substrate;
   (e) sputtering Ti from said target and simultaneously flowing a nitrogen-containing gas into said deposition chamber to form a layer containing TiN on said substrate; and
   (f) applying an RF bias to said electrostatic chuck to resputter said layer containing TiN on said substrate,
wherein said hollow cathode target and said substrate are separated by a source-to-substrate spacing ranging from about 86 mm to about 106 mm.

16. The method of claim 15 wherein said source-to-substrate spacing comprises a distance from a point that is 100 mm below an end of said hollow target cathode to said substrate.

17. The method of claim 15, wherein said source-to-substrate spacing is the same during the depositions of said layer containing Ti on said substrate and said layer containing TiN on said substrate.

18. The method of claim 15, wherein said source-to-substrate spacing differs during the depositions of said layer containing Ti on said substrate and said layer containing TiN on said substrate.

19. The method of claim 15, wherein said Ti layer is deposited to a thickness in a range from about 10 nm to about 70 nm, while said TiN layer is deposited to a thickness in a range from about 10 nm to about 100 nm.

20. A method of forming a Ti layer and a TiN layer on an integrated circuit substrate in a single PVD deposition chamber without use of either a collimator or a shutter comprising the steps:
   providing a hollow cathode target containing titanium within said chamber, said hollow cathode target having a cavity region;
   providing an electromagnetic coil within said chamber;
   providing a substrate within said chamber under said hollow cathode target, said substrate attached to an electrostatic chuck;
   sputtering Ti from said target within said cavity region in a non-nitrided mode to form a layer containing Ti on said substrate by providing said electromagnetic coil with a current while simultaneously applying an RF bias to said electrostatic chuck to resputter said layer containing Ti on said substrate; and
   sequentially forming a layer containing TiN over said Ti layer by sputtering Ti from said target within said cavity region by providing said electromagnetic coil with said current while simultaneously flowing a nitrogen-containing gas into said deposition chamber and applying an RF bias to said electrostatic chuck to resputter said layer containing TiN, said nitrogen-containing gas being flown into said chamber outside of said cavity region thereby preventing said nitrogen-containing gas from reaching said hollow cathode target and avoiding any risk of nitrogen contaminating a subsequent Ti deposition process performed after the deposition of the layer containing TiN,
wherein said resputtering of said layers containing Ti and TiN modulates film coverage properties of said layers containing Ti and TiN selected from the group consisting of film thickness, film texture, stoichiometry of the film, layer performance, step coverage, grain size, grain orientation and surface roughness.

21. The method of claim 20 wherein said Ti and TiN layers are deposited at a fixed source to substrate distance.

22. The method of claim 20 wherein said Ti and TiN layers are deposited at differing source to substrate distances.

23. The method of claim 20 further including providing an inert gas within said chamber to form a plasma between said Ti and said inert gas, said plasma being concentrated within the cavity region of said hollow cathode target.

24. The method of claim 23 wherein said plasma is formed by applying a negative voltage at said hollow target cathode.

25. The method of claim 23 wherein said plasma is directed towards said substrate, said RF bias is applied to said electrostatic chuck to increase an energy of said inert gas near a surface of said substrate thereby imparting directionality to Ti+ atoms from said plasma for deposition of said Ti and TiN layers on said substrate.

26. The method of claim 23 wherein said inert gas comprises argon.

* * * * *

UNITED STATES PATENT AND TRADEMARK OFFICE
CERTIFICATE OF CORRECTION

PATENT NO. : 6,652,718 B1
DATED : November 25, 2003
INVENTOR(S) : D'Couto et al.

It is certified that error appears in the above-identified patent and that said Letters Patent is hereby corrected as shown below:

Column 1,
Line 18, delete "TiN)" and substitute therefor -- (TiN) --.

Column 14,
Lines 64-65, between "thickness of" and "nm" insert -- 25 --.

Column 16,
Table 2, in third heading across, delete "FWHM (☐, 2 Theta)" and substitute therefore -- FWHM (σ, 2 Theta) --.

Column 17,
Line 7, between ""about" and "kW" insert therefore -- 30 --.

Signed and Sealed this

Ninth Day of March, 2004

JON W. DUDAS
*Acting Director of the United States Patent and Trademark Office*